US012147623B2

(12) United States Patent
Ma et al.

(10) Patent No.: US 12,147,623 B2
(45) Date of Patent: Nov. 19, 2024

(54) SENSOR DEVICE AND DRIVING METHOD THEREOF

(71) Applicant: SAMSUNG DISPLAY CO., LTD., Yongin-si (KR)

(72) Inventors: Hyung Gun Ma, Yongin-si (KR); Sang Hyun Heo, Yongin-si (KR); Moon Jae Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/819,071

(22) Filed: Aug. 11, 2022

(65) Prior Publication Data

US 2023/0176668 A1 Jun. 8, 2023

(30) Foreign Application Priority Data

Dec. 2, 2021 (KR) ........................ 10-2021-0171308

(51) Int. Cl.
*G06F 3/041* (2006.01)
*G09G 3/20* (2006.01)
(Continued)

(52) U.S. Cl.
CPC ........ *G06F 3/0412* (2013.01); *G06F 3/04166* (2019.05); *G09G 3/2096* (2013.01);
(Continued)

(58) Field of Classification Search
CPC ............... G06F 3/0412; G06F 3/04166; G06F 3/04182; G06F 3/044; G09G 3/2096;
(Continued)

(56) References Cited

U.S. PATENT DOCUMENTS 7,099,496 B2 * 8/2006 Benkley, III ....... G06V 40/1335 324/661
8,975,963 B2 3/2015 Sharma et al.
(Continued)

FOREIGN PATENT DOCUMENTS

KR 10-2018-0015025 2/2018
KR 10-2018-0025228 3/2018
(Continued)

OTHER PUBLICATIONS

Jiren Yuan, "A Charge Sampling Mixer With Embedded Filter Function for Wireless Applications", ICMMT 2000. 2000 2nd International Conference on Microwave and Millimeter Wave Technology Proceedings, 6826148, Sep. 14-16, 2000, pp. 315-318.
(Continued)

*Primary Examiner* — Ricardo Osorio
(74) *Attorney, Agent, or Firm* — F. Chau & Associates, LLC

(57) ABSTRACT

A sensor device of the present invention includes first sensors receiving a plurality of driving signals; second sensors outputting a plurality of sensing signals in response to the driving signals; and a sensor receiver connected receiving the sensing signals from the second sensors, and including a band pass filter filtering the sensing signals. The band pass filter includes a multi-path filter in which a frequency of the driving signals is set as a center frequency; a gain amplifier amplifying signals filtered through the multi-path filter according to a predetermined gain value; and a buffer isolating the multi-path filter and the gain amplifier from each other.

20 Claims, 24 Drawing Sheets

(51) Int. Cl.
*H03F 3/68* (2006.01)
*H03F 3/70* (2006.01)

(52) U.S. Cl.
CPC ................. *H03F 3/68* (2013.01); *H03F 3/70* (2013.01); *G09G 2310/0291* (2013.01); *H03F 2200/168* (2013.01)

(58) Field of Classification Search
CPC ..... G09G 2310/0291; H03F 3/68; H03F 3/70; H03F 2200/168; H03F 2203/45526; H03F 2203/45528; H03F 2203/45574; H03F 3/45183; H03F 3/45475
See application file for complete search history.

(56) References Cited

U.S. PATENT DOCUMENTS

| | | | |
|---|---|---|---|
| 9,014,653 | B2 | 4/2015 | Madadi et al. |
| 9,634,702 | B2 | 4/2017 | Jabbour et al. |
| 9,639,733 | B2 * | 5/2017 | Kremin ................. G06F 3/0445 |
| 9,847,772 | B2 | 12/2017 | Darvishi et al. |
| 10,120,509 | B2 * | 11/2018 | Chandran ............. G06F 3/0443 |
| 10,128,819 | B2 | 11/2018 | Hedayati et al. |
| 10,146,985 | B2 * | 12/2018 | Chung ............... G06V 40/1306 |
| 10,732,766 | B2 | 8/2020 | Malhotra |
| 11,481,072 | B2 * | 10/2022 | Fan ...................... H03K 17/962 |
| 2012/0206404 | A1 * | 8/2012 | Chan ................... G06F 3/04182 345/174 |
| 2013/0033442 | A1 * | 2/2013 | Chu .................... G06F 3/04182 345/173 |
| 2013/0106759 | A1 | 5/2013 | Fredriksen et al. |
| 2013/0300690 | A1 * | 11/2013 | Yang ....................... G06F 3/044 345/173 |
| 2014/0078101 | A1 | 3/2014 | Katsurahira |
| 2015/0242672 | A1 * | 8/2015 | Benkley, III ....... G06V 40/1359 382/124 |
| 2016/0117051 | A1 | 4/2016 | Han et al. |
| 2017/0185182 | A1 * | 6/2017 | Chandran ........... G06F 3/04184 |
| 2017/0235423 | A1 * | 8/2017 | Hwang ................... G05F 3/262 345/174 |
| 2018/0039809 | A1 * | 2/2018 | Chung ............... G06V 40/1324 |
| 2018/0061307 | A1 * | 3/2018 | Inoue .................. H03F 3/45183 |
| 2018/0157355 | A1 * | 6/2018 | Kim ...................... G06F 3/0446 |
| 2018/0278442 | A1 | 9/2018 | Rogers et al. |
| 2019/0257870 | A1 * | 8/2019 | Shimada .................. H03F 3/70 |
| 2020/0089385 | A1 | 3/2020 | Han |
| 2020/0371620 | A1 | 11/2020 | Wu |
| 2021/0313401 | A1 | 10/2021 | Lee et al. |
| 2023/0176668 | A1 | 6/2023 | Ma et al. |
| 2023/0185403 | A1 | 6/2023 | Kang et al. |
| 2023/0305657 | A1 | 9/2023 | Jung et al. |

FOREIGN PATENT DOCUMENTS

| | | |
|---|---|---|
| KR | 10-1931077 | 12/2018 |
| KR | 10-1986371 | 5/2019 |
| KR | 10-2249736 | 5/2021 |
| KR | 10-2021-0123454 | 10/2021 |

OTHER PUBLICATIONS

Seunghoon Ko et al., “Low Noise Capacitive Sensor for Multi-touch Mobile handset’s applications”, IEEE, 11836069, Nov. 8-10, 2010, 4 pages.
Seunghoon Ko, “A Mutual Capacitance Touch Readout IC with Synchronization in Touch and Mobile Display Driving for High Refresh Rate AMOLED Panels”, Micromachines 2021, 12, 922, Jul. 31, 2021, 12 pages.
Final Office Action issued on Apr. 4, 2024 in cross-referenced U.S. Appl. No. 18/075,845.
Notice of Allowance dated Jun. 26, 2024 in related U.S. Appl. No. 18/075,845.

* cited by examiner

Bypass mode:
AFE1
ADC
Analog-to-Digital Converter
OUT
LPF
Low Pass Filter
MXR
Mixer
fLO
BPF
Band Pass Filter
CAMP
Charge Amplifier
RXL1
RXL2

NPFb
FOUTP
FOUTN
ADRb
ADR
OMCK3
BOM1b
OMCK4
BOM2b
OMCK1
BOM3b
OMCK2
BOM4b
SS4
BOM1
BOM2
BOM3
BOM4
OMCK1
OMCK2
OMCK3
OMCK4
SS3
BLPF1
BLPF2
BLPF3
BLPF4
SS2
IMCK1
IMCK2
IMCK3
IMCK4
BIM1
BIM2
BIM3
BIM4
SS1
NINP
BIM1b
IMCK3
BIM2b
IMCK4
BIM3b
IMCK1
BIM4b
IMCK2
NINN

SENSOR DEVICE AND DRIVING METHOD THEREOF

CROSS-REFERENCE TO RELATED APPLICATION

The U.S. non-provisional patent application claims priority under 35 U.S.C. § 119(a) to Korean Patent Application No. 10-2021-0171308 filed on Dec. 2, 2021 in the Korean Intellectual Property Office, the disclosure of which is incorporated by reference in its entirety herein.

1. Technical Field

The present disclosure relates to a sensor device and a driving method thereof.

2. Discussion of Related Art

Electronic devices such as smart phones, digital cameras, notebook computers, navigation systems, and smart televisions, include display devices for displaying images. The display device includes a display panel that generates and displays an image and may include various input devices such as a sensor unit for sensing a user's input.

The sensor unit may include a band pass filter for obtaining signals of a desired frequency band from sensing signals. The band pass filter may include an operational amplifier (OP-amp), a resistor, and a capacitor.

Since parameters such as center frequency, a Q-factor, and gain depend on values of the resistor and the capacitor, it may be difficult to meet system requirements.

SUMMARY

At least one embodiment of the disclosure provides a sensor device including a band pass filter capable of independently setting parameters, and a driving method thereof.

A sensor device according to an embodiment of the present invention includes first sensors receiving a plurality of driving signals; second sensors outputting a plurality of sensing signals in response to the driving signals; and a sensor receiver receiving the sensing signals from the second sensors, and including a band pass filter filtering the sensing signals. The band pass filter may include a multi-path filter in which a frequency of the driving signals is set as a center frequency; a gain amplifier amplifying signals filtered through the multi-path filter according to a predetermined gain value; and a buffer isolating the multi-path filter and the gain amplifier from each other.

At least one output terminal of the multi-path filter may be connected to at least one input terminal of the buffer, and at least one output terminal of the buffer may be connected to at least one input terminal of the gain amplifier.

The sensor receiver may further include a charge amplifier receiving the sensing signals from two of the second sensors, and at least one input terminal of the band pass filter may be connected to at least one output terminal of the charge amplifier.

The multi-path filter may include a plurality of paths connected in parallel between an input terminal and an output terminal, a first path among the plurality of paths may sequentially include a first input mixer, a first filter, and a first output mixer, and a frequency and a phase of a first input clock signal received by the first input mixer may be the same as a frequency and a phase of a first output clock signal received by the first output mixer.

A second path among the plurality of paths may sequentially include a second input mixer, a second filter, and a second output mixer, a frequency and a phase of a second input clock signal received by the second input mixer may be the same as a frequency and a phase of a second output clock signal received by the second output mixer, the frequency of the first input clock signal may be the same as the frequency of the second input clock signal, and the phase of the first input clock signal may be different from the phase of the second input clock signal.

The multi-path filter may include a plurality of first paths connected in parallel between a first input terminal and a first output terminal and a plurality of second paths connected in parallel between a second input terminal and a second output terminal, and the first paths and the second paths may share same filters.

One of the first paths may sequentially include a first input mixer, a first filter, and a first output mixer, one of the second paths may include a second input mixer and a second output mixer, an output terminal of the second input mixer may be connected to an input terminal of the first filter, and an input terminal of the second output mixer may be connected to an output terminal of the first filter.

A frequency and a phase of a first input clock signal received by the first input mixer may be the same as a frequency and a phase of a first output clock signal received by the first output mixer, a frequency and a phase of a second input clock signal received by the second input mixer may be the same as a frequency and a phase of a second output clock signal received by the second output mixer, the frequency of the first input clock signal may be the same as the frequency of the second input clock signal, and the phase of the first input clock signal may be different from the phase of the second input clock signal.

The buffer may include a differential difference amplifier including a first non-inverting input terminal, a first inverting input terminal, a second non-inverting input terminal, a second inverting input terminal, an inverting output terminal, and a non-inverting output terminal, an output signal of the inverting output terminal of the differential difference amplifier may be fed back to the first non-inverting input terminal, an output signal of the non-inverting output terminal of the differential difference amplifier may be fed back to the second inverting input terminal, the first inverting input terminal and the second non-inverting input terminal of the differential difference amplifier may be connected to output terminals of the multi-path filter, and the inverting output terminal and the non-inverting output terminal of the differential difference amplifier may be connected to input terminals of the gain amplifier.

The buffer may include a differential difference amplifier including a first non-inverting input terminal, two or more first inverting input terminals, two or more second non-inverting input terminals, a second inverting input terminal, an inverting output terminal, and a non-inverting output terminal, an output signal of the inverting output terminal of the differential difference amplifier may be fed back to the first non-inverting input terminal, an output signal of the non-inverting output terminal of the differential difference amplifier may be fed back to the second inverting input terminal, the first inverting input terminals and the second non-inverting input terminals of the differential difference amplifier may be connected to output terminals of the multi-path filter, and the inverting output terminal and the non-inverting output terminal of the differential difference amplifier may be connected to input terminals of the gain amplifier.

The gain amplifier may include a fully differential amplifier including a non-inverting input terminal, an inverting input terminal, an inverting output terminal, and a non-inverting output terminal; a first resistor connected between a first input terminal of the gain amplifier and the non-inverting input terminal of the fully differential amplifier; a second resistor connected between the inverting output terminal and the non-inverting input terminal of the fully differential amplifier; a third resistor connected between a second input terminal of the gain amplifier and the inverting input terminal of the fully differential amplifier; and a fourth resistor connected between the non-inverting output terminal and the inverting input terminal of the fully differential amplifier. A resistance ratio of the first resistor and the second resistor may be the same as a resistance ratio of the third resistor and the fourth resistor.

The gain amplifier may include a fully differential amplifier including a non-inverting input terminal, an inverting input terminal, an inverting output terminal, and a non-inverting output terminal; a first input capacitor connected between a first input terminal of the gain amplifier and the non-inverting input terminal of the fully differential amplifier; a first feedback capacitor and a first feedback resistor connected in parallel between the inverting output terminal and the non-inverting input terminal of the fully differential amplifier; a second input capacitor connected between a second input terminal of the gain amplifier and the inverting input terminal of the fully differential amplifier; and a second feedback capacitor and a second feedback resistor connected in parallel between the non-inverting output terminal and the inverting input terminal of the fully differential amplifier. A capacitance ratio of the first input capacitor and the first feedback capacitor may be the same as a capacitance ratio of the second input capacitor and the second feedback capacitor.

A driving method of a sensor device according to an embodiment of the present invention include supplying driving signals to first sensors; receiving sensing signals from two adjacent second sensors; amplifying a difference between the sensing signals to generate an amplified signal; and filtering the amplified signal through a band pass filter. The band pass filter includes a multi-path filter in which a frequency of the driving signals is set as a center frequency; a gain amplifier amplifying signals filtered through the multi-path filter according to a predetermined gain value; and a buffer isolating the multi-path filter and the gain amplifier from each other.

At least one output terminal of the multi-path filter may be connected to at least one input terminal of the buffer, and at least one output terminal of the buffer may be connected to at least one input terminal of the gain amplifier.

The multi-path filter may include a plurality of paths connected in parallel between an input terminal and an output terminal, a first path among the plurality of paths may sequentially include a first input mixer, a first filter, and a first output mixer, and a frequency and a phase of a first input clock signal received by the first input mixer may be the same as a frequency and a phase of a first output clock signal received by the first output mixer.

A second path among the plurality of paths may sequentially include a second input mixer, a second filter, and a second output mixer, a frequency and a phase of a second input clock signal received by the second input mixer may be the same as a frequency and a phase of a second output clock signal received by the second output mixer, the frequency of the first input clock signal may be the same as the frequency of the second input clock signal, and the phase of the first input clock signal may be different from the phase of the second input clock signal.

The multi-path filter may include a plurality of first paths connected in parallel between a first input terminal and a first output terminal and a plurality of second paths connected in parallel between a second input terminal and a second output terminal, and the first paths and the second paths may share same filters.

One of the first paths may sequentially include a first input mixer, a first filter, and a first output mixer, one of the second paths may include a second input mixer and a second output mixer, an output terminal of the second input mixer may be connected to an input terminal of the first filter, an input terminal of the second output mixer may be connected to an output terminal of the first filter, a frequency and a phase of a first input clock signal received by the first input mixer may be the same as a frequency and a phase of a first output clock signal received by the first output mixer, a frequency and a phase of a second input clock signal received by the second input mixer may be the same as a frequency and a phase of a second output clock signal received by the second output mixer, the frequency of the first input clock signal may be the same as the frequency of the second input clock signal, and the phase of the first input clock signal may be different from the phase of the second input clock signal.

The buffer may include a differential difference amplifier including a first non-inverting input terminal, a first inverting input terminal, a second non-inverting input terminal, a second inverting input terminal, an inverting output terminal, and a non-inverting output terminal, an output signal of the inverting output terminal of the differential difference amplifier may be fed back to the first non-inverting input terminal, an output signal of the non-inverting output terminal of the differential difference amplifier may be fed back to the second inverting input terminal, the first inverting input terminal and the second non-inverting input terminal of the differential difference amplifier may be connected to output terminals of the multi-path filter, and the inverting output terminal and the non-inverting output terminal of the differential difference amplifier may be connected to input terminals of the gain amplifier.

The buffer may include a differential difference amplifier including a first non-inverting input terminal, two or more first inverting input terminals, two or more second non-inverting input terminals, a second inverting input terminal, a non-inverting output terminal, and an inverting output terminal, an output signal of the non-inverting output terminal of the differential difference amplifier may be fed back to the first non-inverting input terminal, an output signal of the inverting output terminal of the differential difference amplifier may be fed back to the second inverting input terminal, the first inverting input terminals and the second non-inverting input terminals of the differential difference amplifier may be connected to output terminals of the multi-path filter, and the inverting output terminal and the non-inverting output terminal of the differential difference amplifier may be connected to input terminals of the gain amplifier.

A sensor device according to an embodiment of the present invention includes a plurality of first sensors receiving a plurality of driving signals; a plurality of second sensors outputting a plurality of sensing signals in response to the driving signals; and a sensor receiver receiving the sensing signals from the second sensors, and including a band pass filter filtering the sensing signals. The band pass filter includes a multi-path filter filtering at a frequency of the driving signals, a differential difference amplifier receiving an output of the multi-path filter, and a gain amplifier amplifying signals output by the differential difference amplifier.

DETAILED DESCRIPTION

Figure 1:
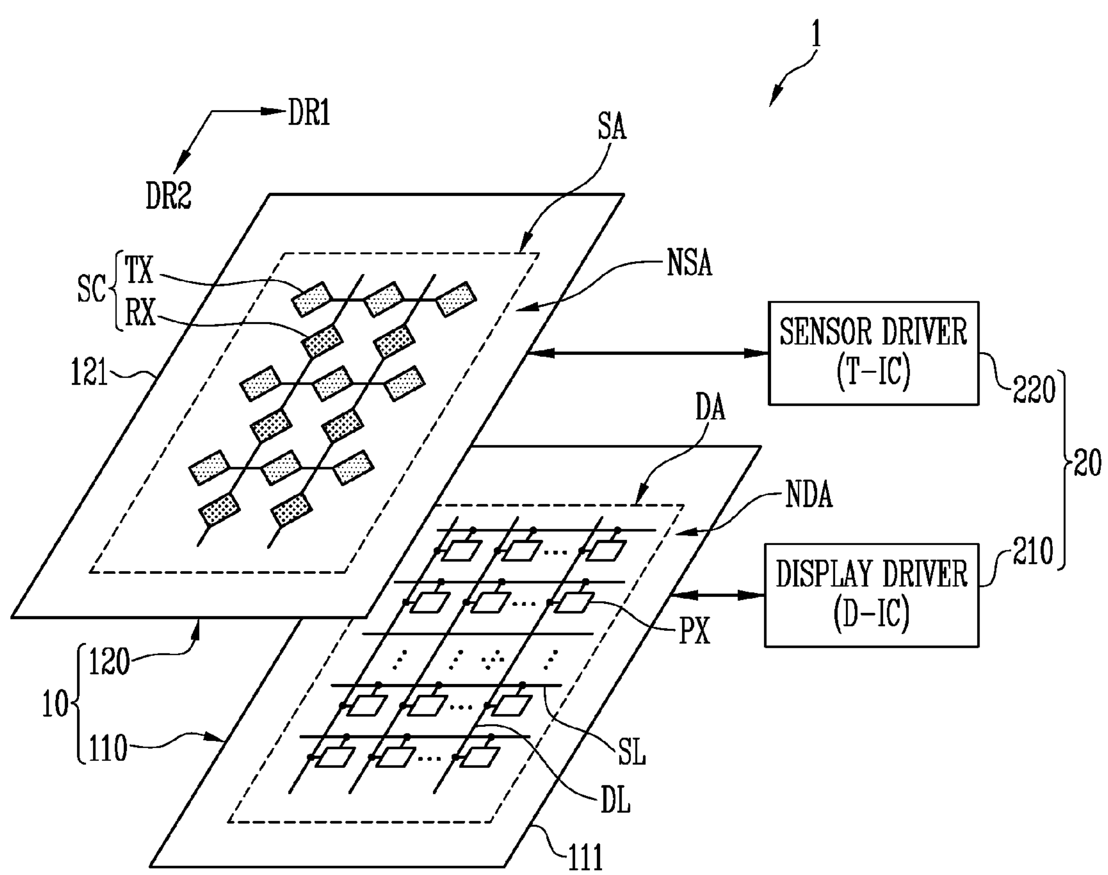
FIGS. 1 and 2 are diagrams for explaining a display device according to an embodiment of the present invention.

Hereinafter, various embodiments of the present invention will be described in detail with reference to the accompanying drawings so that those of ordinary skill in the art may implement the present invention. The present invention may be embodied in various different forms and is not limited to the embodiments described herein.

In order to clearly describe the present invention, parts that are not related to the description are omitted, and the same or similar components are denoted by the same reference numerals throughout the specification. Therefore, the reference numerals described above may also be used in other drawings.

In addition, the size and thickness of each component shown in the drawings are shown for convenience of description, and thus the present invention is not necessarily limited to those shown in the drawings. In the drawings, thicknesses may be exaggerated to clearly express the layers and regions.

In addition, in the description, the expression "is the same" may mean "substantially the same". That is, it may be the same enough to convince those of ordinary skill in the art to be the same. In other expressions, "substantially" may be omitted.

Figure 2:
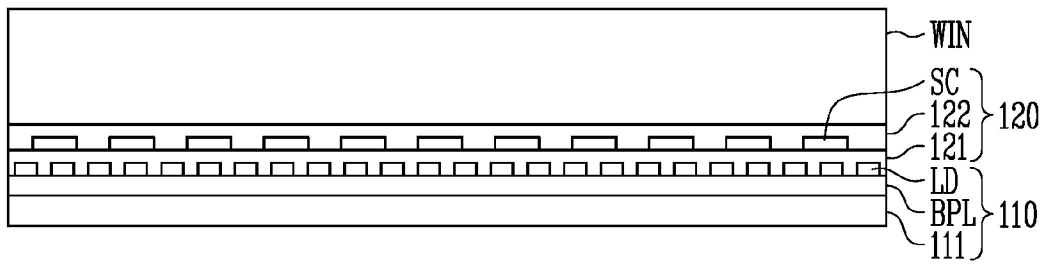

FIGS. 1 and 2 are diagrams for explaining a display device according to an embodiment of the present invention.

Referring to FIG. 1, a display device 1 according to an embodiment of the present invention may include a panel 10 and a driving circuit unit 20 for driving the panel 10.

For example, the panel 10 may include a display unit 110 for displaying an image and a sensor unit 120 for sensing touch, pressure, a fingerprint, hovering, or the like. For example, the display unit 110 may include pixels PX and the sensor unit 120 may include sensors SC positioned to overlap at least some of the pixels PX. In an embodiment, the sensors SC may include first sensors TX and second sensors RX. In an embodiment (for example, a self-capacitance type), the sensors SC are not divided into a first sensor and a second sensor, but may be configured as one type of sensors. The driving circuit unit 20 may include a display driver 210 for driving the display unit 110 and a sensor driver 220 for driving the sensor unit 120. For example, the pixels PX may display an image in units of display frame periods. For example, the sensors SC may sense a user's input in units of sensing frame periods. A sensing frame period and a display frame period may be independent of each other or may be different from each other. The sensing frame period and the display frame period may be synchronized with each other or may be asynchronous.

According to an embodiment, the display unit 110 and the sensor unit 120 may be manufactured independently of each other, and may be arranged and/or combined such that at least one region overlaps each other. Alternatively, in another embodiment, the display unit 110 and the sensor unit 120 may be integrally manufactured. For example, the sensor unit 120 may be directly formed on at least one substrate constituting the display unit 110 (for example, upper and/or lower substrates of the display panel, or a thin film encapsulation layer) or on other insulating layers or various functional films (for example, an optical layer or a protective layer).

Although FIG. 1 shows an embodiment in which the sensor unit 120 is disposed on a front side (for example, an upper surface on which an image is displayed) of the display unit 110, the position of the sensor unit 120 is not limited thereto. For example, in another embodiment, the sensor unit 120 may be disposed on the back or both surfaces of the display unit 110. In another embodiment, the sensor unit 120 may be disposed on at least one edge region of the display unit 110.

The display unit 110 may include a display substrate 111 and a plurality of pixels PX formed on the display substrate 111. The pixels PX may be disposed in a display area DA of the display substrate 111.

The display substrate 111 may include the display area DA in which an image is displayed and a non-display area NDA outside the display area DA. According to an embodiment, the display area DA may be disposed in a central area of the display unit 110, and the non-display area NDA may be disposed in an edge area of the display unit 110 to surround the display area DA. In an embodiment, none of the pixels are disposed in the non-display area NDA.

The display substrate 111 may be a rigid substrate or a flexible substrate, and the material or physical properties thereof are not particularly limited. For example, the display substrate 111 may be a rigid substrate made of glass or tempered glass, or a flexible substrate made of a thin film made of plastic or metal.

In the display area DA, scan lines SL, data lines DL, and the pixels PX connected to the scan lines SL and the data lines DL may be disposed. The pixels PX may be selected by a scan signal of a turn-on level supplied from the scan lines SL to receive a data signal from the data lines DL, and may emit light having a luminance corresponding to the data signal. Accordingly, an image corresponding to the data signal may be displayed in the display area DA. However, the structure and driving method of the pixels PX are not particularly limited. For example, each of the pixels PX may be implemented as a pixel employing various structures and driving methods.

In the non-display area NDA, various wirings and/or built-in circuits connected to the pixels PX of the display area DA may be disposed. For example, in the non-display area NDA, a plurality of wirings for supplying various power sources and control signals to the display area DA may be disposed. In addition, a scan driver and the like may be further disposed in the non-display area NDA.

However, the type of the display unit 110 is not particularly limited. For example, the display unit 110 may be implemented as a self-emission type display panel such as an organic light emitting display panel. However, when the display unit 110 is implemented as a self-emission type, each pixel is not necessarily limited to a case where only an organic light emitting element is included. For example, a light emitting element of each pixel may be composed of an organic light emitting diode, an inorganic light emitting diode, a quantum dot/well light emitting diode, or the like. A plurality of light emitting elements may be provided in each pixel. In this case, the plurality of light emitting elements may be connected in series, in parallel, or in series and parallel. Alternatively, the display unit 110 may be implemented as a non-emission type display panel such as a liquid crystal display panel. When the display unit 110 is implemented as a non-emission type, the display device 1 may further include a light source such as a backlight unit.

The sensor unit 120 may include a sensor substrate 121 and a plurality of sensors SC formed on the sensor substrate 121. The sensors SC may be disposed in a sensing area SA of the sensor substrate 121.

The sensor substrate 121 may include the sensing area SA capable of sensing a touch input or the like, and a peripheral area NSA outside the sensing area SA. According to an embodiment, the sensing area SA may be disposed to overlap at least one area of the display area DA. For example, the sensing area SA may be set as an area corresponding to the display area DA (for example, an area overlapping the display area DA), and the peripheral area NSA may be set as an area corresponding to the non-display area NDA (for example, an area overlapping the non-display area NDA). In this case, when a touch input is provided on the display area DA, the touch input may be detected through the sensor unit 120.

The sensor substrate 121 may be a rigid or flexible substrate, and may be composed of at least one insulating layer. In addition, the sensor substrate 121 may be a transparent or translucent substrate that transmits light, but is not limited thereto. However, the material and physical properties of the sensor substrate 121 are not particularly limited. For example, the sensor substrate 121 may be a rigid substrate made of glass or tempered glass, or a flexible substrate made of a thin film made of plastic or metal. In addition, according to some embodiments, at least one substrate constituting the display unit 110 (for example, the display substrate 111, an encapsulation substrate, and/or the thin film encapsulation layer), or at least one insulating film or a functional film disposed on the inner and/or outer surface of the display unit 110 may be used as the sensor substrate 121.

The sensing area SA may be set as an area capable of responding to a touch input (that is, an active area of a sensor). To this end, the sensors SC for sensing the touch input or the like may be disposed in the sensing area SA. According to an embodiment, the sensors SC may include the first sensors TX and the second sensors RX.

For example, each of the first sensors TX may extend in a first direction DR1. The first sensors TX may be arranged in a second direction DR2. The second direction DR2 may be different from the first direction DR1. For example, the second direction DR2 may be a direction orthogonal to the first direction DR1. In another embodiment, a direction in which the first sensors TX extend and a direction in which the first sensors TX are arranged may follow other configurations. Each of the first sensors TX may have a form in which first cells having a relatively large area and first bridges having a relatively narrow area are connected. Although FIG. 1 shows the first cells having a diamond shape, the first cells may have various other shapes such as a circular shape, a square shape, a triangle shape, a mesh shape, and the like. For example, the first bridges may be integrally formed on the same layer as the first cells. In another embodiment, the first bridges may be formed in a different layer from the first cells, and may electrically connect adjacent first cells to each other.

For example, each of the second sensors RX may extend in the second direction DR2. The second sensors RX may be arranged in the first direction DR1. In another embodiment, a direction in which the second sensors RX extend and a direction in which the second sensors RX are arranged may follow other configurations. Each of the second sensors RX may have a form in which second cells having a relatively large area and second bridges having a relatively narrow area are connected. Although FIG. 1 shows the second cells having a diamond shape, the second cells may have various other shapes such as a circular shape, a square shape, a triangle shape, a mesh shape, and the like. For example, the second bridges may be integrally formed on the same layer as the second cells. In another embodiment, the second bridges may be formed in a different layer from the second cells, and electrically connect adjacent second cells to each other.

According to an embodiment, each of the first sensors TX and the second sensors RX may have conductivity by including at least one of a metal material, a transparent conductive material, and various other conductive materials. For example, the first sensors TX and the second sensors RX may include at least one of various metal materials including gold (Au), silver (Ag), aluminum (Al), molybdenum (Mo), chromium (Cr), titanium (Ti), nickel (Ni), neodymium (Nd), copper (Cu), platinum (Pt), and alloys thereof. In this case, the first sensors TX and the second sensors RX may be configured in a mesh shape. In addition, the first sensors TX and the second sensors RX may include at least one of various transparent conductive materials, such as silver nanowires (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide ($SnO_2$), carbon nanotube, and graphene. In addition, the first sensors TX and the second sensors RX may have conductivity by including at least one of various conductive materials. In addition, each of the first sensors TX and the second sensors RX may be formed of a single layer or a multilayer, but cross-sectional structures thereof are not particularly limited.

Sensor lines for electrically connecting the sensors SC to the sensor driver 220 or the like may be disposed in the peripheral area NSA of the sensor unit 120.

The driving circuit unit 20 may include the display driver 210 for driving the display unit 110 and the sensor driver 220 for driving the sensor unit 120. In an embodiment, the display driver 210 and the sensor driver 220 may be composed of integrated circuit (IC) chips independent of each other. In another embodiment, at least a portion of the display driver 210 and the sensor driver 220 may be integrated together in one IC.

The display driver 210 may be electrically connected to the display unit 110 to drive the pixels PX. For example, the display driver 210 may include a data driver and a timing controller, and the scan driver may be separately mounted in the non-display area NDA of the display unit 110. In another embodiment, the display driver 210 may include all or at least a part of the data driver, the timing controller, and the scan driver. In another embodiment, the display driver 210 may correspond to at least one of a graphics processing unit (GPU), a central processing unit (CPU), an application processor (AP), and the like. In another embodiment, the display driver 210 may include at least one of a GPU, a CPU, and an AP and a timing controller.

The sensor driver 220 may be electrically connected to the sensor unit 120 to drive the sensor unit 120. The sensor driver 220 may include a sensor transmitter and a sensor receiver. According to an embodiment, the sensor transmitter and the sensor receiver may be integrated in one IC, but the present invention is not limited thereto.

Referring to FIG. 2, for example, the sensor unit 120 may be stacked on the display unit 110, and a window WIN may be stacked on the sensor unit 120.

The display unit 110 may include the display substrate 111, a circuit element layer BPL formed on the display substrate 111, and light emitting elements LD formed on the circuit element layer BPL. The circuit element layer BPL may include pixel circuits for driving the light emitting elements LD of the pixels PXL, the scan lines SL, the data lines DL, and the like.

The sensor unit 120 may include the sensor substrate 121, the sensors SC formed on the sensor substrate 121, and a protective layer 122 covering the sensors SC. In the embodiment of FIG. 2, the sensor substrate 121 is shown in the form of an encapsulation film covering the pixels PXL. In another embodiment, the sensor substrate 121 may be present separately from the encapsulation film covering the pixels PXL.

The window WIN may be a protective member disposed at the top of the module of the display device 1, and may be a transparent substrate through which light can be substantially transmitted. The window WIN may have a multilayer structure selected from a glass substrate, a plastic film, and a plastic substrate. The window WIN may include a rigid or flexible substrate, but the material constituting the window WIN is not particularly limited.

Although not shown, the display device 1 may further include a polarizing plate (or another type of antireflection layer) that prevents reflection of external light between the window WIN and the sensor unit 120.

Figure 3:
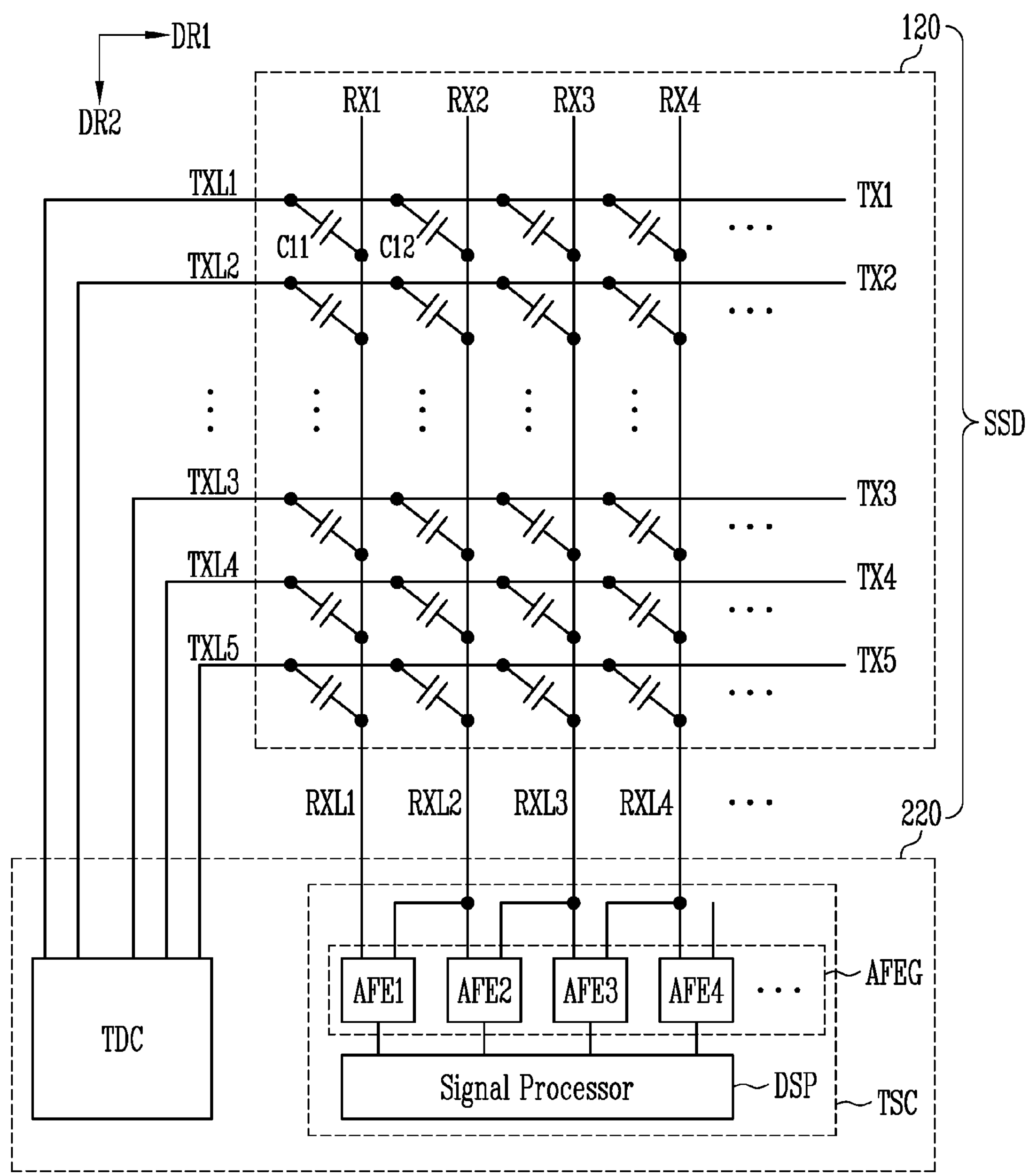
FIG. 3 is a diagram for explaining a sensor device according to an embodiment of the present invention.

FIG. 3 is a diagram for explaining a sensor device according to an embodiment of the present invention.

Referring to FIG. 3, a sensor device SSD according to an embodiment of the present invention may include a sensor unit 120 and a sensor driver 220. The sensor device SSD may be included in the display device 1. The sensor device SSD may be configured as a product that is separate and independent of the display device 1.

The sensor unit 120 may include first sensors TX1, TX2, TX3, TX4, and TX5 and second sensors RX1, RX2, RX3, and RX4. The first sensors TX1 to TX5 may extend in the first direction DR1 and may be arranged in the second direction DR2. The second sensors RX1 to RX4 may extend in the second direction DR2 and may be arranged in the first direction DR1. The second sensors RX1 to RX4 may intersect the first sensors TX1 to TX5. The first sensors TX1 to TX5 and the second sensors RX1 to RX4 may form a mutual capacitance. For example, a capacitance C11 may be formed between a first sensor TX1 and a second sensor RX1, and a capacitance C12 may be formed between the first sensor TX1 and a second sensor RX2. The sensor driver 220 may determine whether a user's touch input has been performed by detecting a change in capacitances C11 and C12.

The sensor driver 220 may include a sensor transmitter TDC and a sensor receiver TSC. The sensor transmitter TDC may be connected to the first sensors TX1 to TX5 and may supply driving signals to the first sensors TX1 to TX5. The sensor transmitter TDC may be connected to the first sensors TX1 to TX5 through first sensor lines TXL1, TXL2, TXL3, TXL4, and TXL5.

The sensor receiver TSC may be connected to the second sensors RX1 to RX4 and may receive sensing signals from the second sensors RX1 to RX4. The sensor receiver TSC may be connected to the second sensors RX1 to RX4 through second sensor lines RXL1, RXL2, RXL3, and RXL4. The sensor receiver TSC may include an analog front-end group AFEG and a digital signal processor DSP.

The analog front-end group AFEG may include a plurality of analog front-ends AFE1, AFE2, AFE3, and AFE4. Each of the analog front-ends AFE1 to AFE4 may be connected to two adjacent second sensors among the second sensors RX1 to RX4. For example, a first analog front-end AFE1 may be connected to the first sensor RX1 and the second sensor RX2. A second analog front-end AFE2 may be connected to the second sensor RX2 and a second sensor RX3. A third analog front-end AFE3 may be connected to the second sensor RX3 and a second sensor RX4. A fourth analog front-end AFE4 may be connected to the second sensor RX4 and a second sensor (not shown). Each of the analog front-ends AFE1 to AFE4 may generate a digital signal from which a common noise is removed by using sensing signals of the adjacent second sensors as differential signals, so that the signal-to-noise ratio (SNR) can be increased.

The digital signal processor DSP may calculate sensing values using digital signals provided by the analog front-end group AFEG. For example, a digital signal provided from the first analog front-end AFE1 may correspond to a difference between a level lv2 of a sensing signal of the second sensor RX2 and a level lv1 of a sensing signal of the first sensor RX1 (lv2−lv1). A digital signal provided from the second analog front-end AFE2 may correspond to a difference between a level lv3 of a sensing signal of the third sensor RX3 and a level lv2 of a sensing signal of the second sensor RX2 (lv3−lv2). A digital signal provided from the third analog front-end AFE3 may correspond to a difference between a level lv4 of a sensing signal of the fourth sensor RX4 and a level lv3 of a sensing signal of the third sensor RX3 (lv4−lv3).

For example, the digital signal processor DSP may obtain a relative level lv2' of the sensing signal of the second sensor RX2, a relative level lv3' of the sensing signal of the third sensor RX3, and a relative level lv4' of the sensing signal of the fourth sensor RX4 using Equations 1 to 3 below.

$$lv2' = lv2 - 1v1 = (lv2 - lv1) \quad \text{[Equation 1]}$$

$$lv3' = lv3 - 1v1 = (lv3 - lv2) \pm (lv2 - lv1) \quad \text{[Equation 2]}$$

$$lv4' = lv4 - lv1 = (lv4 - lv3) + (lv3 - lv2) \pm (lv2 - lv1) \quad \text{[Equation 3]}$$

The digital signal processor DSP may use these levels lv2', lv3', and lv4' as the sensing values to determine whether a user's touch input has been performed, or may transmit the sensing values to the display driver 210.

Figure 4:
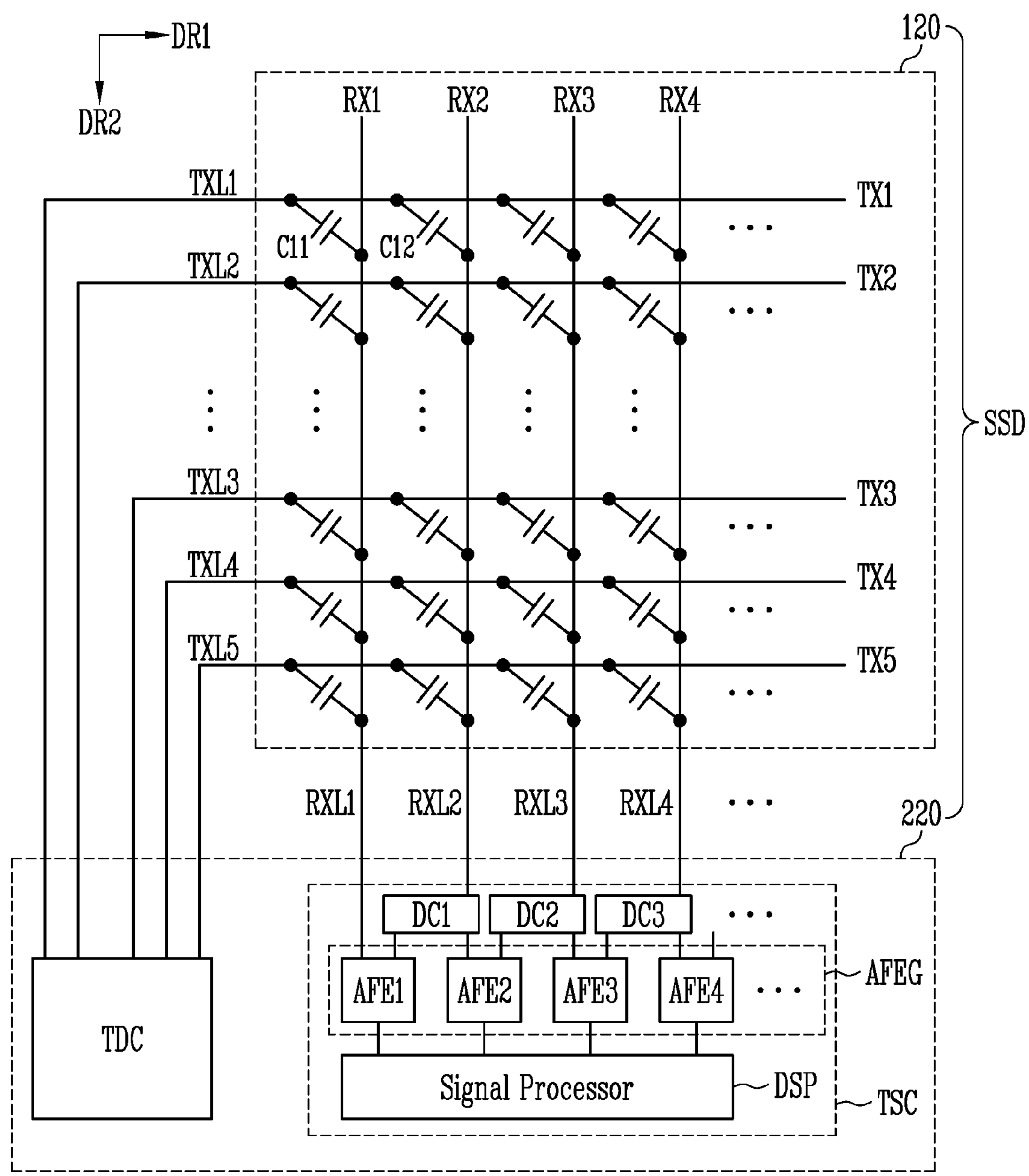
FIG. 4 is a diagram for explaining a sensor device according to an embodiment of the present invention.

FIG. 4 is a diagram for explaining a sensor device according to an embodiment of the present invention.

Compared to the sensor receiver TSC of FIG. 3, a sensor receiver TSC of FIG. 4 is different in that it further includes distribution circuits DC1, DC2, and DC3.

The distribution circuits DC1, DC2, and DC3 may be disposed between at least some of the second sensors RX1 to RX4 and the analog front-ends AFE1 to AFE4, may generate a plurality of signals having the same magnitude (for example, the same voltage level and the same amount of current) based on each of the sensing signals provided from at least some of the second sensors RX1 to RX4, and may distribute the generated signals to the analog front-ends AFE1 to AFE4. For example, the distribution circuits DC1, DC2, and DC3 may include an amplifier, a buffer, and the like, and may amplify or mirror each of the sensing signals to output them.

For example, a first distribution circuit DC1 may receive a second sensing signal provided from the second sensor RX2 and may provide signals having the same magnitude as the second sensing signal to the first analog front-end AFE1 and the second analog front-end AFE2, respectively. For reference, when the second sensing signal does not pass through the first distribution circuit DC1, the second sensing signal may be simultaneously supplied to the first analog front-end AFE1 and the second analog front-end AFE2. Accordingly, due to the relative increase in the load with respect to the second sensing signal, the magnitude of the second sensing signal may be different from the magnitude of the first sensing signal received from the second sensor RX1. For example, the second sensing signal may be smaller than a first sensing signal. Accordingly, in an embodiment, the signals having the same magnitude as the second sensing signal may be provided to the first analog front-end AFE1 and the second analog front-end AFE2 using the first distribution circuit DC1, respectively.

Similarly, a second distribution circuit DC2 may receive a third sensing signal provided from the second sensor RX3 and may provide signals having the same magnitude as the third sensing signal to the second analog front-end AFE2 and the third analog front-end AFE3, respectively. A third distribution circuit DC3 may receive a fourth sensing signal provided from the second sensor RX4 and may provide signals having the same magnitude as the fourth sensing signal to the third analog front-end AFE3 and the fourth analog front-end AFE4, respectively.

Figure 5:
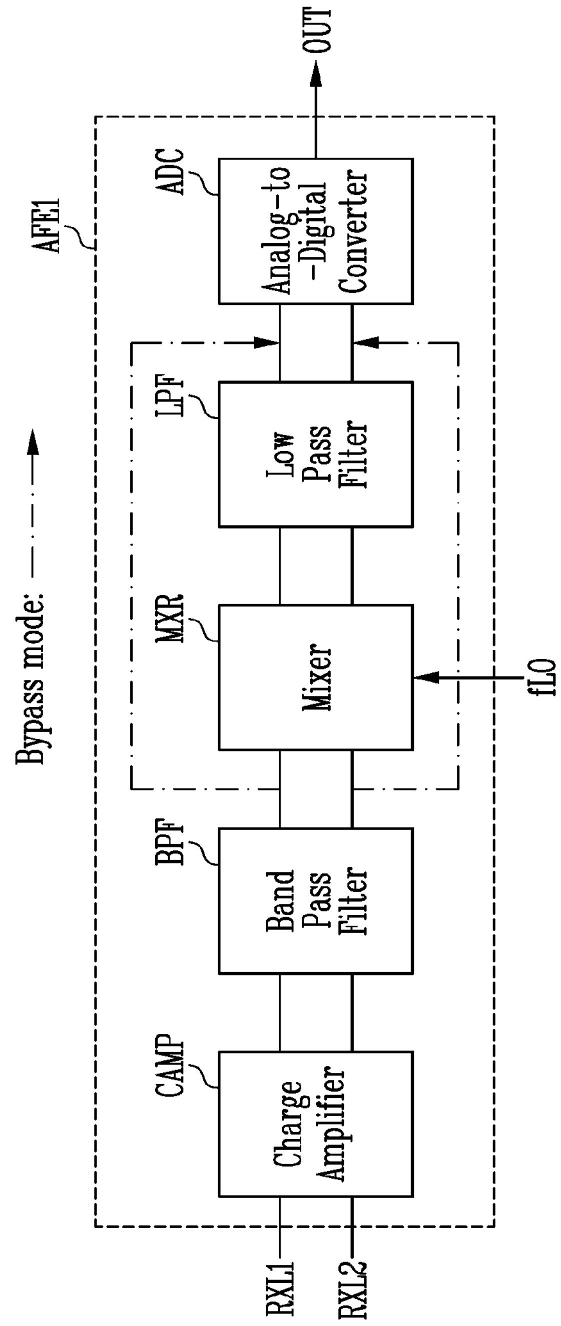
FIG. 5 is a diagram for explaining an analog front-end according to an embodiment of the present invention.

FIG. 5 is a diagram for explaining an analog front-end according to an embodiment of the present invention.

Referring to FIG. 5, the first analog front-end AFE1 according to an embodiment of the present invention may include a charge amplifier CAMP, a band pass filter BPF, a mixer MXR, a low pass filter LPF, and an analog-to-digital converter ADC. Other analog front-ends AFE2, AFE3, and AFE4 may have the same configuration as the first analog front-end AFE1, except that only the second sensors connected thereto are different, and thus duplicate descriptions will be omitted (refer to FIGS. 3 and 4).

The charge amplifier CAMP may receive the sensing signals from two RX1 and RX2 of the second sensors RX1 to RX4. For example, the charge amplifier CAMP may have a first input terminal (for example, a non-inverting terminal) connected to a second sensor line RXL2 and a second input terminal (for example, an inverting terminal) connected to a first sensor line RXL1. Accordingly, the charge amplifier CAMP may output a signal corresponding to a difference between a level of the sensing signal of the second sensor RX2 and a level of the sensing signal of the first sensor RX1. The charge amplifier CAMP may be configured as a fully differential amplifier, and may output a signal corresponding to the difference between the level of the sensing signal of the second sensor RX2 and the level of the sensing signal of the first sensor RX1, and an inverting signal thereof. The output signal and the inverting signal may be a differential signal. In FIG. 5, it is assumed that elements BPF, MXR, LPF, and ADC connected to an output terminal of the charge amplifier CAMP have specifications requiring an input signal and an inverted input signal, and two internal signal lines are shown in parallel. The elements BPF, MXR, LPF, and ADC may remove common mode noise using the input signal and the inverted input signal.

However, in another embodiment, the elements BPF, MXR, LPF, and ADC may be configured to have a specification requiring only the input signal without the inverted input signal. In this case, the output terminal of the charge amplifier CAMP may be configured as single-ended, and only the signal corresponding to the difference between the level of the sensing signal of the second sensor RX2 and the level of the sensing signal of the first sensor RX1 may be output. In this embodiment, internal signal lines connecting the charge amplifier CAMP and each element BPF, MXR, LPF, or ADC would be shown as one.

The band pass filter BPF may be connected to the output terminal of the charge amplifier CAMP. The band pass filter BPF may filter the sensing signals (or a difference signal between the sensing signals and an inverted signal thereof). The band pass filter BPF may filter an output signal of the charge amplifier CAMP to have a set frequency band. For example, a frequency band may be preset to include the frequency (or center frequency) of the sensing signals, and noise components may be located outside the frequency band. The center frequency of the sensing signals may be the same as the center frequency of the driving signals.

The mixer MXR may mix an output signal of the band pass filter BPF and a local clock signal fLO. The mixer MXR may include frequency components corresponding to the difference and sum of the frequency of the output signal of the band pass filter BPF and the frequency of the local clock signal fLO. For example, when the frequency of the output signal of the band pass filter BPF is the same as the frequency of the local clock signal fLO, an output signal of the mixer MXR may include a frequency component having 0 Hz as the center frequency.

The low pass filter LPF may filter the output signal of the mixer MXR to have a set frequency band. In this case, the set frequency band of the low pass filter LPF may be lower than the set frequency band of the band pass filter BPF. For example, the low pass filter LPF may pass only a signal of a low frequency band having 0 Hz as the center frequency among the output signal of the mixer MXR. Accordingly, the low pass filter LPF may filter frequency components corresponding to noise.

The analog-to-digital converter ADC may convert an output signal of the low pass filter LPF into a digital signal OUT. Since the analog-to-digital converter ADC receives the signal of the low frequency band from the low pass filter LPF, the analog-to-digital converter ADC may be operated at a small sampling rate and may have a clock signal of a low frequency. Thus, power cost and configuration cost may be reduced.

The digital signal processor DSP may determine final sensing values using the digital signal OUT output from each of the analog front-ends AFE1, AFE2, AFE3, and AFE4 (refer to FIG. 3 and Equations 1 to 3).

However, when the sensor receiver TSC is driven in a bypass mode, functions of the mixer MXR and the low pass filter LPF may be digitally performed in the signal processor DSP. In this case, an output of the band pass filter BPF may be directly transferred to an input of the analog-to-digital converter ADC.

Figure 6:
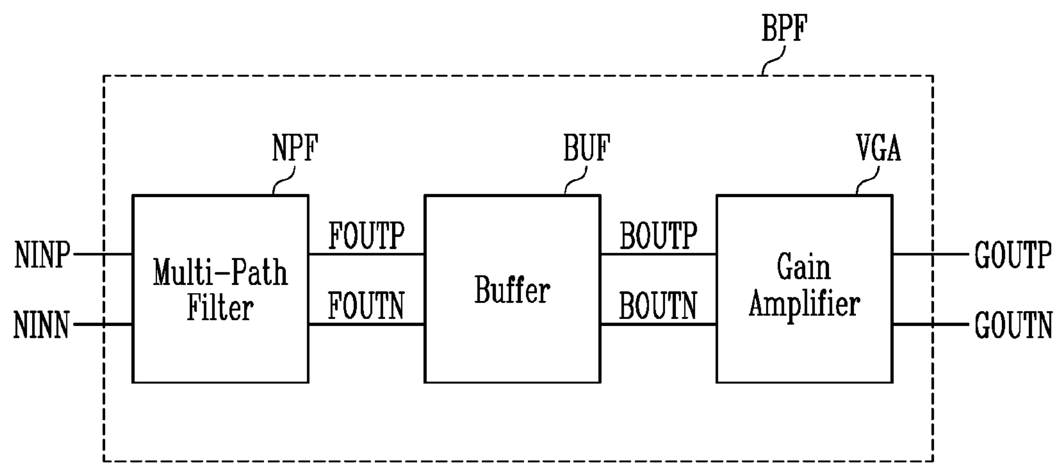
FIG. 6 is a diagram for explaining a band pass filter according to an embodiment of the present invention.

FIG. 6 is a diagram for explaining a band pass filter according to an embodiment of the present invention.

Referring to FIG. 6, the band pass filter BPF according to an embodiment of the present invention may include a multi-path filter NPF, a buffer BUF, and a gain amplifier VGA. At least one output terminal of the multi-path filter NPF may be connected to at least one input terminal of the buffer BUF, and at least one output terminal of the buffer BUF may be connected to at least one input terminal of the gain amplifier VGA.

The multi-path filter NPF may be a filter in which the frequency of the driving signals is set as the center frequency. For example, a pass band frequency of the multi-path filter NPF may be a center frequency of the driving signals. The multi-path filter NPF may receive a first input signal NINP and a second input signal NINN from the charge amplifier CAMP. The second input signal NINN may be an inverted signal of the first input signal NINP. The multi-path filter NPF may generate a first output signal FOUTP by filtering the first input signal NINP with a passband including the center frequency. The multi-path filter NPF may generate a second output signal FOUTN by filtering the second input signal NINN with the passband including the center frequency.

The gain amplifier VGA may generate output signals GOUTP and GOUTN of the band pass filter BPF by amplifying signals BOUTP and BOUTN filtered through the multi-path filter NPF according to a predetermined gain value.

The buffer BUF may isolate the multi-path filter NPF and the gain amplifier VGA from each other. That is, due to the presence of the buffer BUF, the multi-path filter NPF and the gain amplifier VGA may operate independently of each other. Therefore, the multi-path filter NPF may independently determine the center frequency and Q-factor of the band pass filter BPF, and the gain amplifier VGA may independently determine a gain value of the band pass filter BPF. In an embodiment, a gain of the buffer BUF is set to 1. For example, the center frequency and Q-factor of the band pass filter BPF may be determined by only the multi-path filter NPF and the gain value of the buffer BUF may be determined by only the gain amplifier VGA.

Accordingly, a sensor device and a driving method thereof according to an embodiment of the present invention can independently set parameters of the band pass filter BPF.

FIGS. 7 to 13 are diagrams for explaining a multi-path filter according to an embodiment of the present invention.

Figure 7:
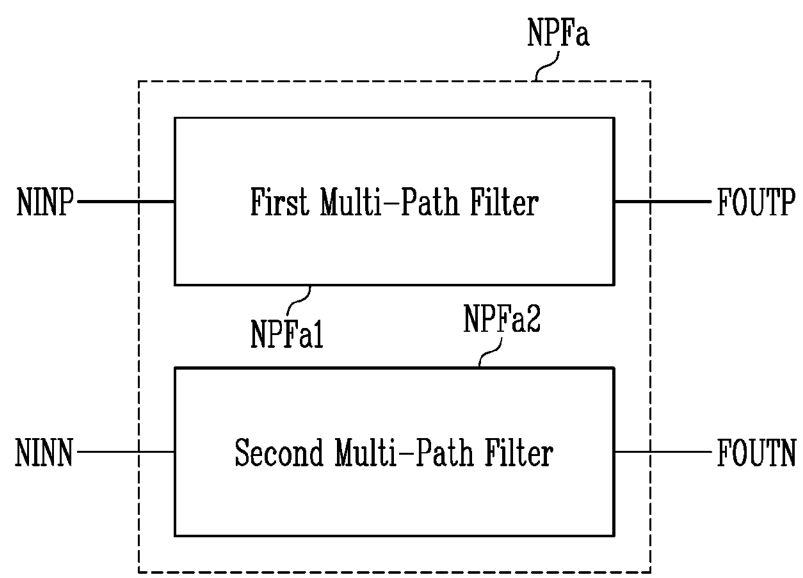
FIGS. 7 to 13 are diagrams for explaining a multi-path filter according to an embodiment of the present invention.

Referring to FIG. 7, a multi-path filter NPFa may include a first multi-path filter NPFa1 and a second multi-path filter NPFa2. The multi-path filter NPF of FIG. 6 may be implemented by the multi-path filter NPFa of FIG. 7. The first multi-path filter NPFa1 may generate the first output signal FOUTP by filtering the first input signal NINP. The second multi-path filter NPFa2 may generate the second output signal FOUTN by filtering the second input signal NINN. In this case, the first multi-path filter NPFa1 and the second multi-path filter NPFa2 may operate independently of each other.

Figure 8:
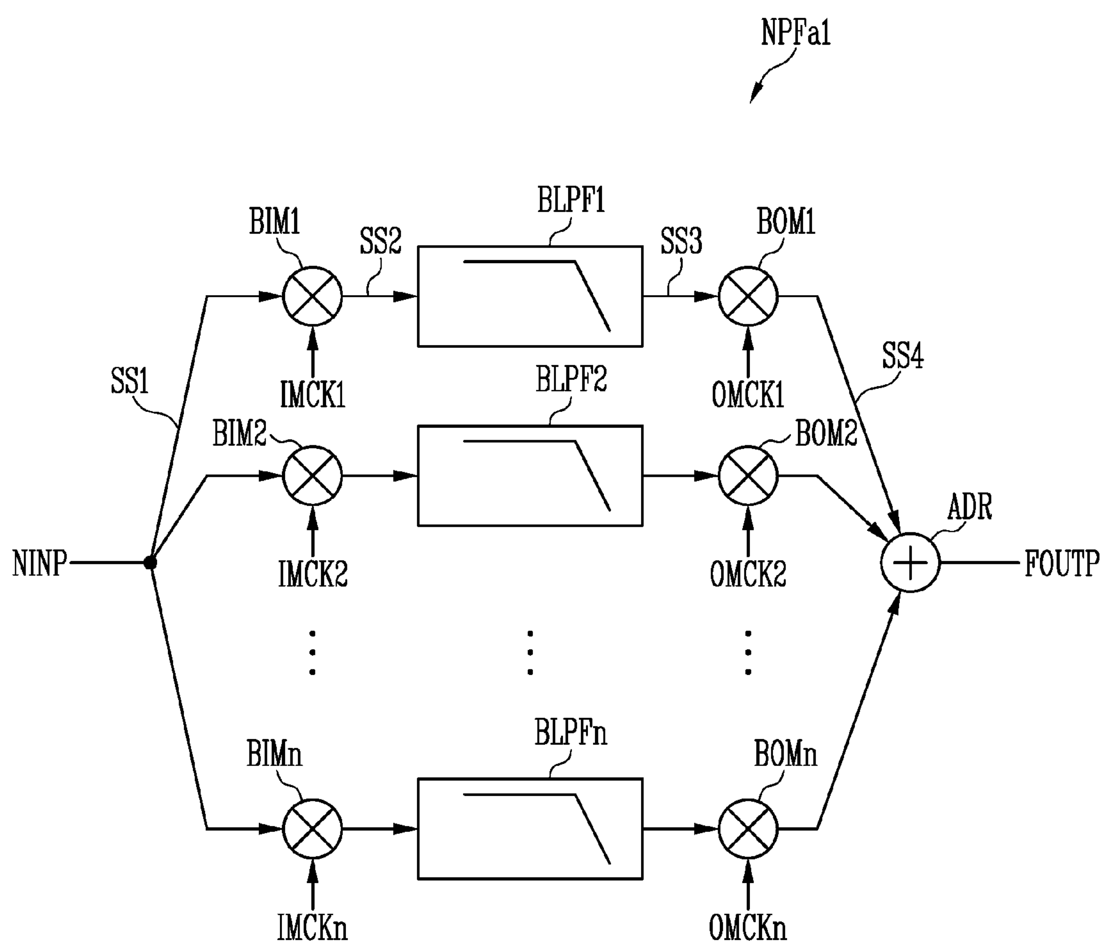

Referring to FIG. 8, a configuration of the first multi-path filter NPFa1 is shown as an example. Since the second multi-path filter NPFa2 may have the same configuration as the first multi-path filter NPFa1, duplicate descriptions thereof will be omitted.

Referring to FIG. 8, the first multi-path filter NPFa1 according to an embodiment of the present invention may include a plurality of paths connected in parallel between an input terminal and an output terminal. The plurality of paths may receive the same input signals SS1. The input signals SS1 may be signals having the same voltage level as the first input signal NINP. Output signals SS4 of the plurality of paths may be added (or combined) in an adder ADR. For example, the adder ADR may be not a special element, but may be an electrical node to which the output signals SS4 of the plurality of paths are commonly applied.

A first path may sequentially include a first input mixer BIM1, a first filter BLPF1, and a first output mixer BOM1. A second path may sequentially include a second input mixer BIM2, a second filter BLPF2, and a second output mixer BOM2. An n-th path may sequentially include an n-th input mixer BIMn, an n-th filter BLPFn, and an n-th output mixer BOMn.

In FIG. 8, it is assumed that the plurality of paths are n, where n may be an integer greater than 0. As n increases, a desired signal can be amplified (the Q-factor increases), but if there are too many paths, harmonic components may also be amplified. Therefore, n is preferably set to an appropriate number. According to experimental results, it may be appropriate for n to be 4 or 8.

The frequency and phase of a first input clock signal IMCK1 received by the first input mixer BIM1 may be the same as the frequency and phase of a first output clock signal OMCK1 received by the first output mixer BOM1. The frequency and phase of a second input clock signal IMCK2 received by the second input mixer BIM2 may be the same as the frequency and phase of a second output clock signal OMCK2 received by the second output mixer BOM2. The frequency and phase of an n-th input clock signal IMCKn received by the n-th input mixer BIMn may be the same as the frequency and phase of an n-th output clock signal OMCKn received by the n-th output mixer BOMn.

Figure 9:
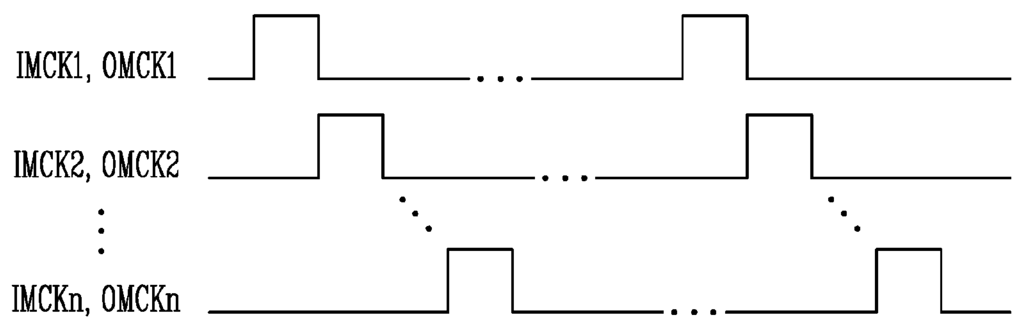

Referring to FIG. 9, the frequencies of the input clock signals IMCK1, IMCK2, and IMCKn may be the same, and the phases of the input clock signals IMCK1, IMCK2, and IMCKn may be different from each other. For example, the frequency of the first input clock signal IMCK1 may be the same as the frequency of the second input clock signal IMCK2, and the phase of the first input clock signal IMCK1 may be different from the phase of the second input clock signal IMCK2. In this way, since frequency components at different time points are added by the adder ADR, the dependence/sensitivity on a specific time point can be reduced. While FIG. 9 shows phases such that pulses of the input clock signals do not overlap one another, the inventive concept is not limited thereto. For example, in alternate embodiment, the pulse of the input clock signal IMCK1 at least partially overlaps the pulse of the second input clock signal IMCK2.

Figure 10:
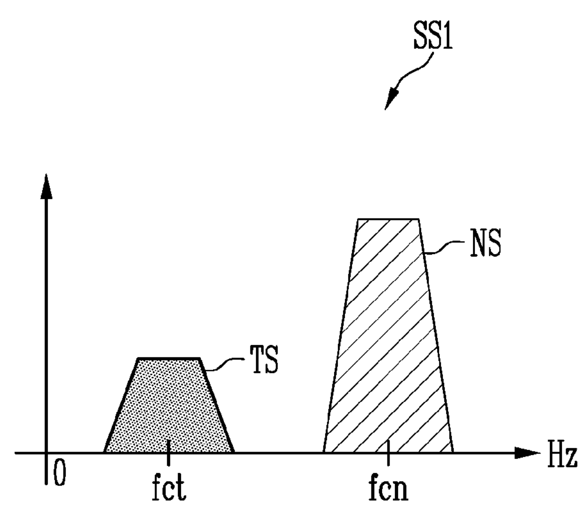

Referring to FIG. 10, frequency components TS and NS of an input signal SS1 are shown as an example. The horizontal axis of the graph may indicate the frequency, and the vertical axis may indicate the magnitude of the signal. It is assumed that the frequency component TS is a frequency component including meaningful information having the frequency fct of a driving signal as the center frequency. It is assumed that the frequency component NS is a noise component having an arbitrary frequency fcn as the center frequency.

Figure 11:
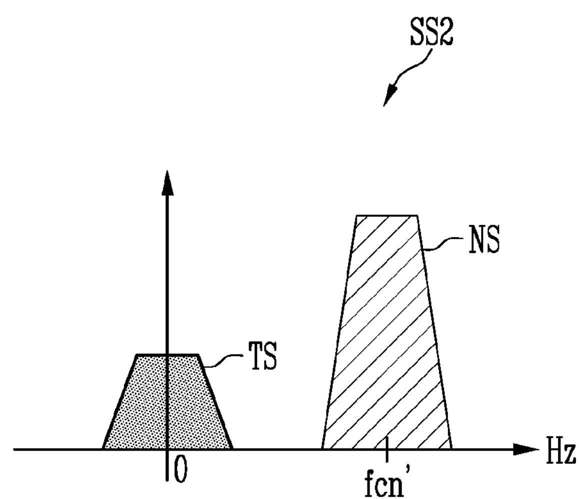

The first input mixer BIM1 may output frequency components corresponding to the difference and sum of the frequency fct of the first input clock signal IMCK1 and the frequency of the input signal SS1 (that is, the frequency of the driving signals). Referring to FIG. 11, an output signal SS2 of the first input mixer BIM1 is partially shown. For example, the frequency components TS and NS corresponding to the difference between the frequency fct of the first input clock signal IMCK1 and the frequency of the input signal SS1 are shown as an example.

The frequencies fct of the input clock signals IMCK1, IMCK2, and IMCKn may be the same as the frequency fct of the driving signals transmitted from the sensor transmitter TDC. For example, the frequency fct of the first input clock signal IMCK1 may be the same as the frequency fct of the driving signals. Accordingly, the center frequency of the frequency component TS may be 0 Hz (0=fct−fct). The center frequency of the frequency component NS may be an arbitrary frequency (fcn'=fcn−fct), but may not be 0 Hz (see FIG. 11).

Figure 12:
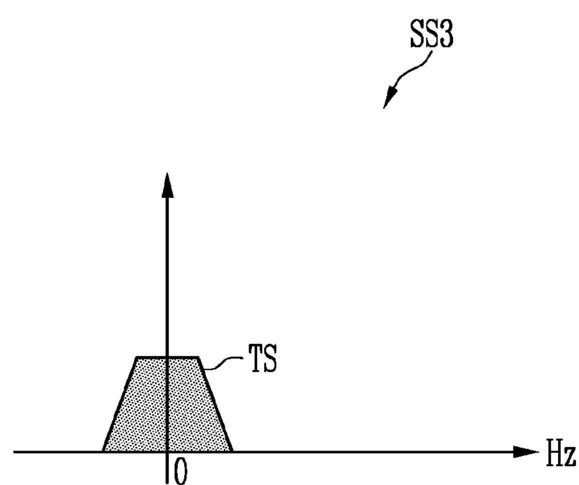

The center frequency of the passband of the first filter BLPF1 may be set as the difference (that is, 0 Hz) or the sum (that is, 2 fct) of the frequency fct of the first input clock signal IMCK1 and the frequency fct of the driving signals. Referring to FIG. 12, a case in which the center frequency of the passband of the first filter BLPF1 is set as the difference (that is, 0 Hz) between the frequency fct of the first input clock signal IMCK1 and the frequency fct of the driving signals is shown as an example. That is, the first filter BLPF1 may be set as a low pass filter having 0 Hz as the center frequency. Accordingly, an output signal SS3 of the first filter BLPF1 may include only the frequency component TS including meaningful information, but may not include the frequency component NS that is a noise component.

Figure 13:
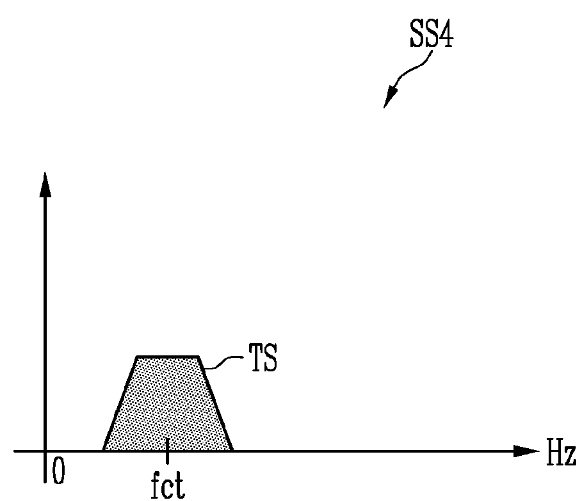

Referring to FIG. 13, the first output mixer BOM1 may output a frequency component corresponding to the difference (that is, (−)fct) and the sum (that is, (−)fct) of the frequency fct of the first output clock signal OMCK1 and the frequency of the input signal SS3 (that is, 0 Hz). For example, the frequency fct of the first output clock signal OMCK1 may be the same as the frequency fct of the first input clock signal IMCK1. As described above, the center frequency of the frequency component TS of the input signal SS3 may be 0 Hz. Accordingly, the frequency component TS having, as the center frequency, the frequency fct corresponding to the sum of the frequency fct of the first output clock signal OMCK1 and the frequency (0 Hz) of the input signal SS3 may be output.

Referring to FIGS. 10 to 13, it can be seen that the meaningful frequency component TS passes without changing the center frequency and the meaningless frequency component NS is removed. That is, the first path may operate as a band pass filter having the frequency fct as the center frequency. Other paths may also operate as a band pass filter having the frequency fct as the center frequency, and duplicate descriptions thereof will be omitted.

According to this embodiment, the band pass filter BPF can be implemented without using an OP-amp. Accordingly, the size and power consumption of the band pass filter BPF can be reduced. In addition, since the frequency of the clock signals IMCK1, IMCK2, IMCKn, OMCK1, OMCK2, and OMCKn is set as the center frequency of the band pass filter BPF, the center frequency and Q factor of the band pass filter BPF can be stably maintained without being affected by temperature, manufacturing process, supply voltage of a power supply device, and the like.

Figure 14:
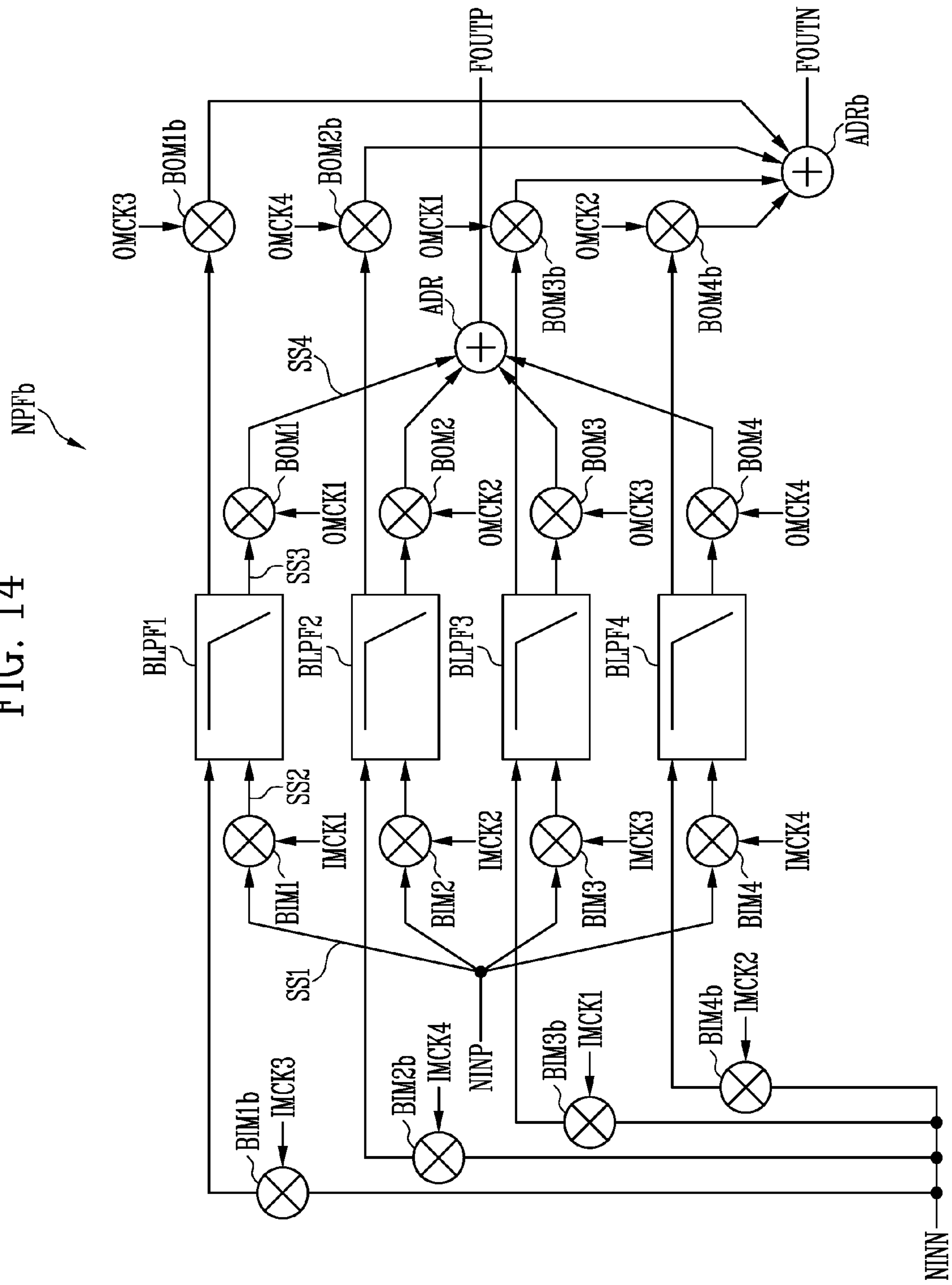
FIGS. 14 and 15 are diagrams for explaining a multi-path filter according to an embodiment of the present invention.
Figure 15:
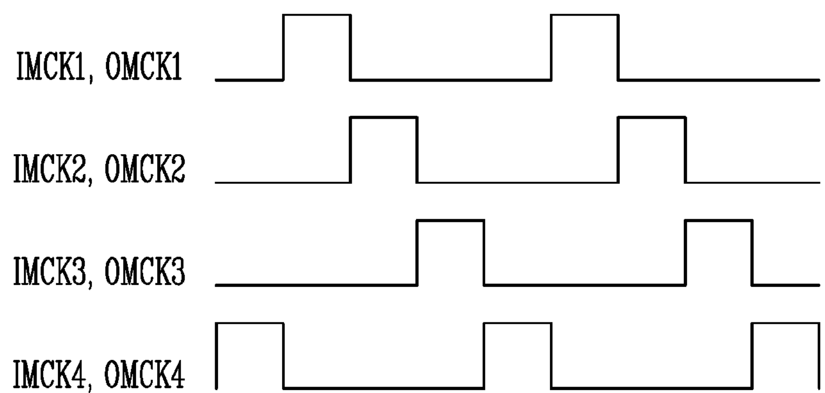

FIGS. 14 and 15 are diagrams for explaining a multi-path filter according to another embodiment of the present invention.

Referring to FIG. 14, a multi-path filter NPFb according to an embodiment of the present invention may include a plurality of first paths connected in parallel between a first input terminal and a first output terminal and a plurality of second paths connected in parallel between a second input terminal and a second output terminal. The multi-path filter NPFb may be used to implement the multi-path filter NPF of FIG. 6. The first input terminal may receive the first input signal NINP, and the first output terminal may output the first output signal FOUTP. The second input terminal may receive the second input signal NINN, and the second output terminal may output the second output signal FOUTN. In this case, the first and second paths may share filters BLPF1, BLPF2, BLPF3, and BLPF4. For convenience of description, the first paths may be composed of four, and the second paths may be composed of four.

One of the first paths may sequentially include a first input mixer BIM1, a first filter BLPF1, and a first output mixer BOM1. In this case, one of the second paths may include a second input mixer BIM1*b* and a second output mixer BOM1*b*. In this case, an output terminal of the second input mixer BIM1*b* may be connected to an input terminal of the first filter BLPF1, and an input terminal of the second output mixer BOM1*b* may be connected to an output terminal of the first filter BLPF1. That is, a first path and a second path corresponding to each other may share the first filter BLPF1.

In this case, the frequency and phase of a first input clock signal IMCK1 received by the first input mixer BIM1 may be the same as the frequency and phase of a first output clock signal OMCK1 received by the first output mixer BOM1. In addition, the frequency and phase of a second input clock signal IMCK3 received by the second input mixer BIM1*b* may be the same as the frequency and phase of a second output clock signal OMCK3 received by the second output mixer BOM1*b*. The frequency of the first input clock signal IMCK1 may be the same as the frequency of the second input clock signal IMCK3, and the phase of the first input clock signal IMCK1 may be different from the phase of the second input clock signal IMCK3. For example, the phase of the second input clock signal IMCK3 may have a difference of 180 degrees from the phase of the first input clock signal IMCK1. Accordingly, even if the first path and the second path share the first filter BLPF1, input/output signals of the first path and the second path may not interfere with each other.

Similarly, one of the first paths may sequentially include a first input mixer BIM2, a first filter BLPF2, and a first output mixer BOM2. In this case, one of the second paths may include a second input mixer BIM2*b* and a second output mixer BOM2*b*. In this case, the first path and the second path may share the first filter BLPF2. The first input mixer BIM2 may receive a first input clock signal IMCK2, and the first output mixer BOM2 may receive a first output clock signal OMCK2. The second input mixer BIM2*b* may receive a second input clock signal IMCK4, and the second output mixer BOM2*b* may receive a second output clock signal OMCK4.

Similarly, one of the first paths may sequentially include a first input mixer BIM3, a first filter BLPF3, and a first output mixer BOM3. In this case, one of the second paths may include a second input mixer BIM3*b* and a second output mixer BOM3*b*. In this case, the first path and the second path may share the first filter BLPF3. The first input mixer BIM3 may receive a first input clock signal IMCK3, and the first output mixer BOM3 may receive a first output clock signal OMCK3. The second input mixer BIM3*b* may receive a second input clock signal IMCK1, and the second output mixer BOM3*b* may receive a second output clock signal OMCK1.

Similarly, one of the first paths may sequentially include a first input mixer BIM4, a first filter BLPF4, and a first output mixer BOM4. In this case, one of the second paths may include a second input mixer BIM4*b* and a second output mixer BOM4*b*. In this case, the first path and the second path may share the first filter BLPF4. The first input mixer BIM4 may receive a first input clock signal IMCK4, and the first output mixer BOM4 may receive a first output clock signal OMCK4. The second input mixer BIM4*b* may receive a second input clock signal IMCK2, and the second output mixer BOM4*b* may receive a second output clock signal OMCK2.

Referring to FIG. 15, the input clock signals IMCK1 to IMCK4 and the output clock signals OMCK1 to OMCK4 when the first paths are composed of four and the second paths are composed of four are shown as an example. For example, the input clock signal IMCK2 (or the output clock signal OMCK2) may be phase delayed by 90 degrees from the input clock signal IMCK1 (or the output clock signal OMCK1). The input clock signal IMCK3 (or the output clock signal OMCK3) may be phase delayed by 90 degrees from the input clock signal IMCK2 (or the output clock signal OMCK2). The input clock signal IMCK4 (or the output clock signal OMCK4) may be phase delayed by 90 degrees from the input clock signal IMCK3 (or the output clock signal OMCK3). The frequencies of the input clock signals IMCK1 to IMCK4 and the output clock signals OMCK1 to OMCK4 may be the same.

Signals SS4 output from the first output mixers BOM1 to BOM4 may be added by a first adder ADR to generate the first output signal FOUTP. In addition, signals output from the second output mixers BOM1*b* to BOM4*b* may be added by a second adder ADRb to generate the second output signal FOUTN. Since operations of the first paths and the second paths may be the same as those described with reference to FIGS. 9 to 13, duplicate descriptions will be omitted.

Figure 16:
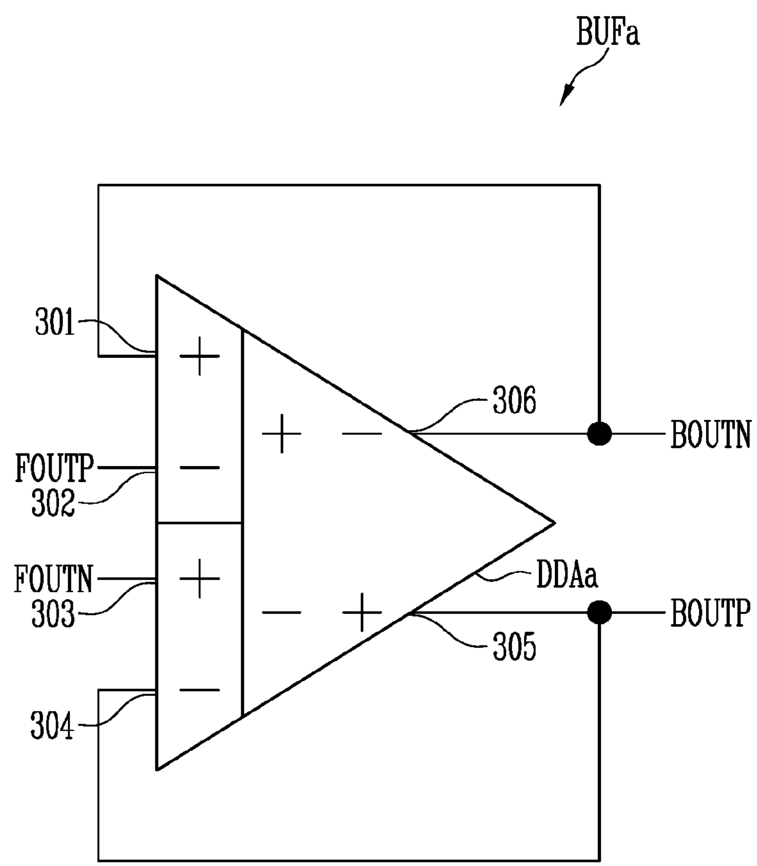
FIG. 16 is a diagram for explaining a buffer according to an embodiment of the present invention.

FIG. 16 is a diagram for explaining a buffer according to an embodiment of the present invention.

Referring to FIG. 16, a buffer BUFa according to an embodiment of the present invention may include a differential difference amplifier DDAa including a first non-inverting input terminal 301, a first inverting input terminal 302, a second non-inverting input terminal 303, a second inverting input terminal 304, an inverting output terminal 306, and a non-inverting output terminal 305. The buffer BUFa may be used to implement the buffer BUF of FIG. 6.

In this case, an output signal BOUTN of the inverting output terminal 306 of the differential difference amplifier DDAa may be fed back to the first non-inverting input terminal 301. An output signal BOUTP of the non-inverting output terminal 305 of the differential difference amplifier DDAa may be fed back to the second inverting input terminal 304. The first inverting input terminal 302 and the second non-inverting input terminal 303 of the differential difference amplifier DDAa may be connected to output terminals of the multi-path filter NPF. For example, the first inverting input terminal 302 may receive the first output signal FOUTP of the multi-path filter NPF, and the second non-inverting input terminal 303 may receive the second output signal FOUTN of the multi-path filter NPF. In addition, the inverting output terminal 306 and the non-inverting output terminal 305 of the differential difference amplifier DDAa may be connected to input terminals of the gain amplifier VGA.

For example, the input/output relationship of the differential difference amplifier DDAa may be defined as in Equation 4 below.

$$VOUTP-VOUTN=A[(VINP1-VINN1)-(VINP2-VINN2)] \quad \text{[Equation 4]}$$

Here, VOUTP may be a voltage of the non-inverting output terminal 305, VOUTN may be a voltage of the inverting output terminal 306, A may be the gain, VINP1 may be a voltage of the first non-inverting input terminal 301, VINN1 may be a voltage of the first inverting input terminal 302, VINP2 may be a voltage of the second non-inverting input terminal 303, and VINN2 may be a voltage of the second inverting input terminal 304. For example, a voltage of the output signal BOUTP may be determined by subtracting a voltage of the second output signal FOUTN from a voltage of the first output signal FOUTP. A voltage of the output signal BOUTN may have the same magnitude as the voltage of the output signal BOUTP, but may have an opposite sign.

Figure 17:
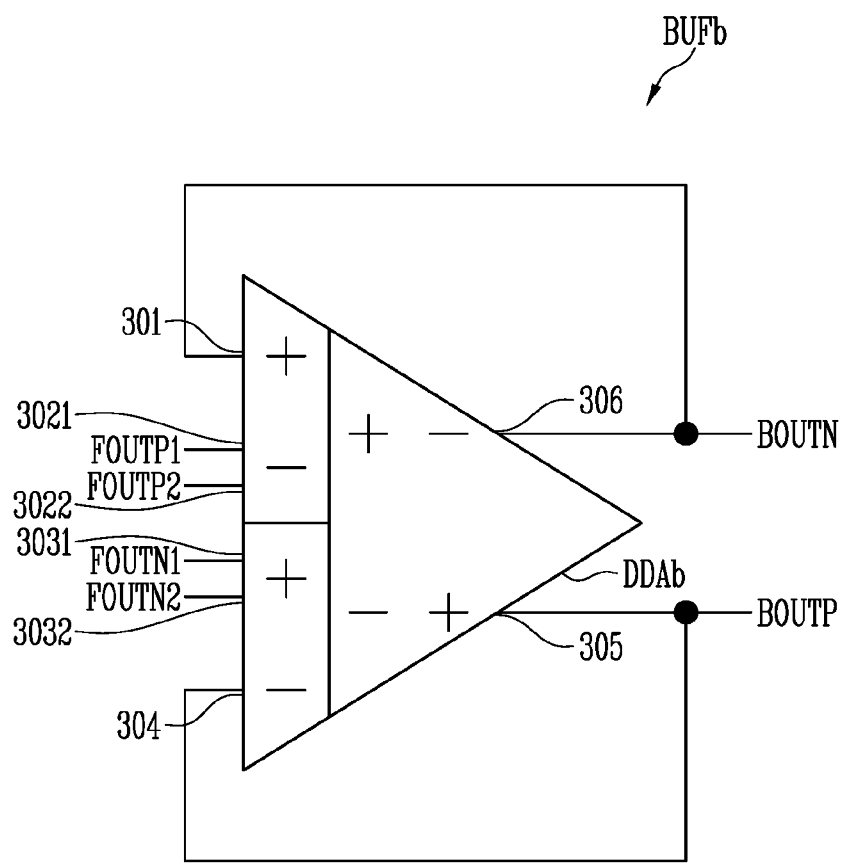
FIGS. 17 and 18 are diagrams for explaining a buffer according to an embodiment of the present invention.
Figure 18:
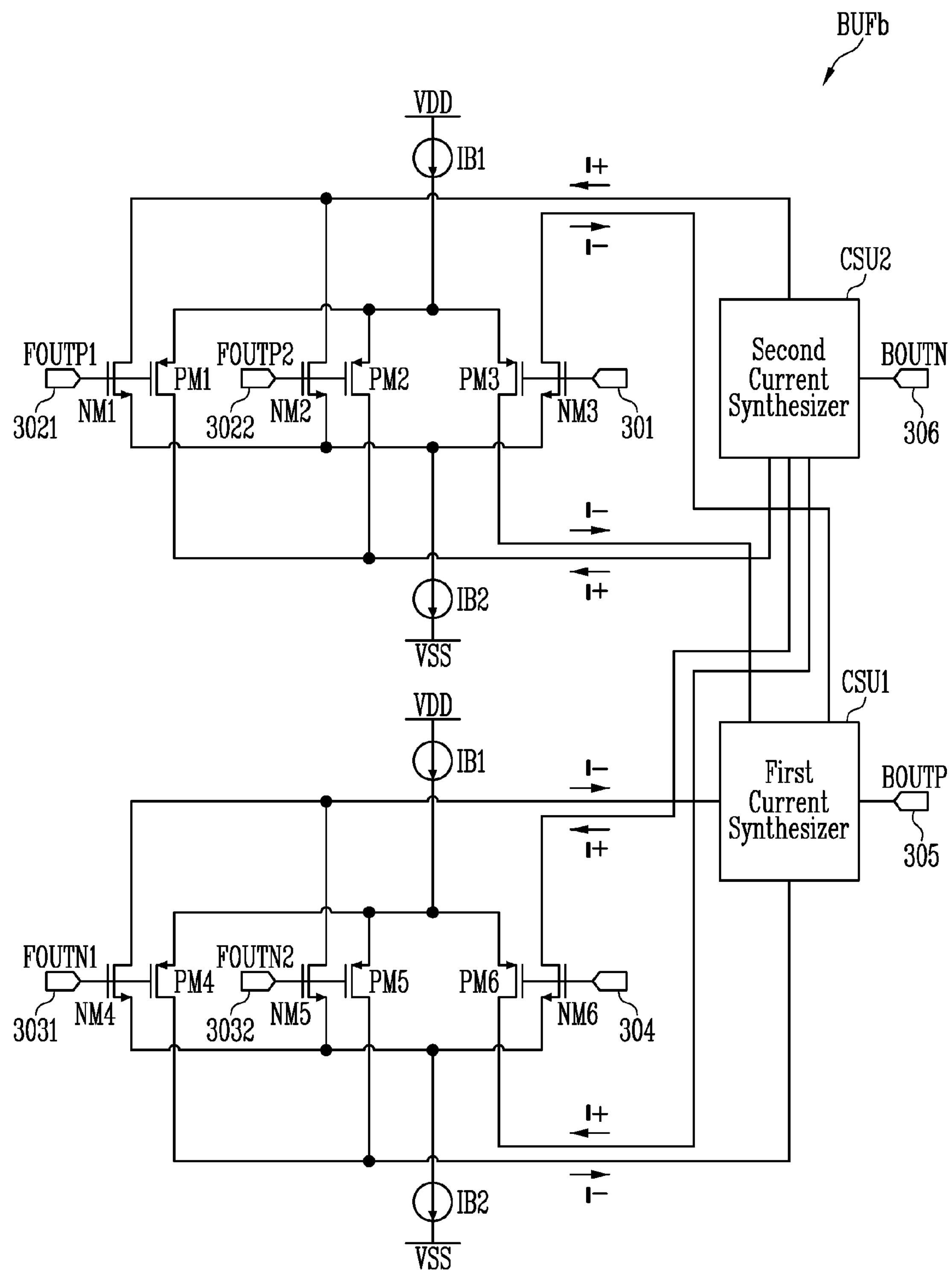

FIGS. 17 and 18 are diagrams for explaining a buffer according to an embodiment of the present invention.

Referring to FIG. 17, a buffer BUFb according to an embodiment of the present invention may include a differential difference amplifier DDAb including a first non-inverting input terminal 301, two or more first inverting input terminals 3021 and 3022, two or more second non-inverting input terminals 3031 and 3032, a second inverting input terminal 304, an inverting output terminal 306, and a non-inverting output terminal 305. The buffer BUFb may be used to implement the buffer BUF of FIG. 6.

In this case, the output signal BOUTN of the inverting output terminal 306 of the differential difference amplifier DDAb may be fed back to the first non-inverting input terminal 301. Also, an output signal of the non-inverting output terminal 305 of the differential difference amplifier DDAb may be fed back to the second inverting input terminal 304. The first inverting input terminals 3021 and 3022 and the second non-inverting input terminals 3031 and 3032 of the differential difference amplifier DDAb may be connected to the output terminals of the multi-path filter NPF. The inverting output terminal 306 and the non-inverting output terminal 305 of the differential difference amplifier DDAb may be connected to the input terminals of the gain amplifier VGA.

The buffer of FIG. 17 may receive output signals of a plurality of multi-path filters NPF and combine them. For example, when a band pass filter BPF having two or more center frequencies is required, a plurality of multi-path filters NPF may be provided.

Referring to FIG. 18, the first inverting input terminals 3021 and 3022 may be connected to gates of transistors NM1, PM1, NM2, and PM2 connected in parallel to each other. In this case, the channel width/length of the transistors NM1, PM1, NM2, and PM2 may correspond to ½ of the channel width/length of transistors NM3 and PM3 having gate electrodes connected to the first non-inverting input terminal 301.

Meanwhile, the second non-inverting input terminals 3031 and 3032 may be connected to gates of transistors NM4, PM4, NM5, and PM5 connected in parallel to each other. In this case, the channel width/length of the transistors NM4, PM4, NM5, and PM5 may correspond to ½ of the channel width/length of transistors NM6 and PM6 having gate electrodes connected to the second inverting input terminal 304.

Source electrodes of the P-type transistors PM1 to PM6 may be connected to a first voltage source VDD and a first current source IB1. Source electrodes of the N-type transistors NM1 to NM6 may be connected to a second voltage source VSS and a second current source IB2. A voltage of the second voltage source VSS may be less than a voltage of the first voltage source VDD.

A first current synthesizer CSU1 may be connected to drain electrodes of the transistors PM3, PM4, PM5, NM3, NM4, and NM5. The first current synthesizer CSU1 may synthesize (or add) currents I− flowing in or flowing out from the drain electrodes of the transistors PM3, PM4, PM5, NM3, NM4, and NM5, and may output a voltage obtained by applying (or multiplying) a predetermined resistance value to the synthesized current as the output signal BOUTP of the non-inverting output terminal 305.

A second current synthesizer CSU2 may be connected to drain electrodes of the transistors PM1, PM2, PM6, NM1, NM2, and NM6. The second current synthesizer CSU2 may synthesize (or add) currents I+ flowing in or flowing out from the drain electrodes of the transistors PM1, PM2, PM6, NM1, NM2, and NM6, and may output a voltage obtained by applying (or multiplying) a predetermined resistance value to the synthesized current as the output signal BOUTN of the inverting output terminal 306.

FIG. 18 is a circuit diagram exemplarily implementing the buffer in FIG. 17, and the buffer BUFb of FIG. 17 may also be implemented using other circuits.

Figure 19:
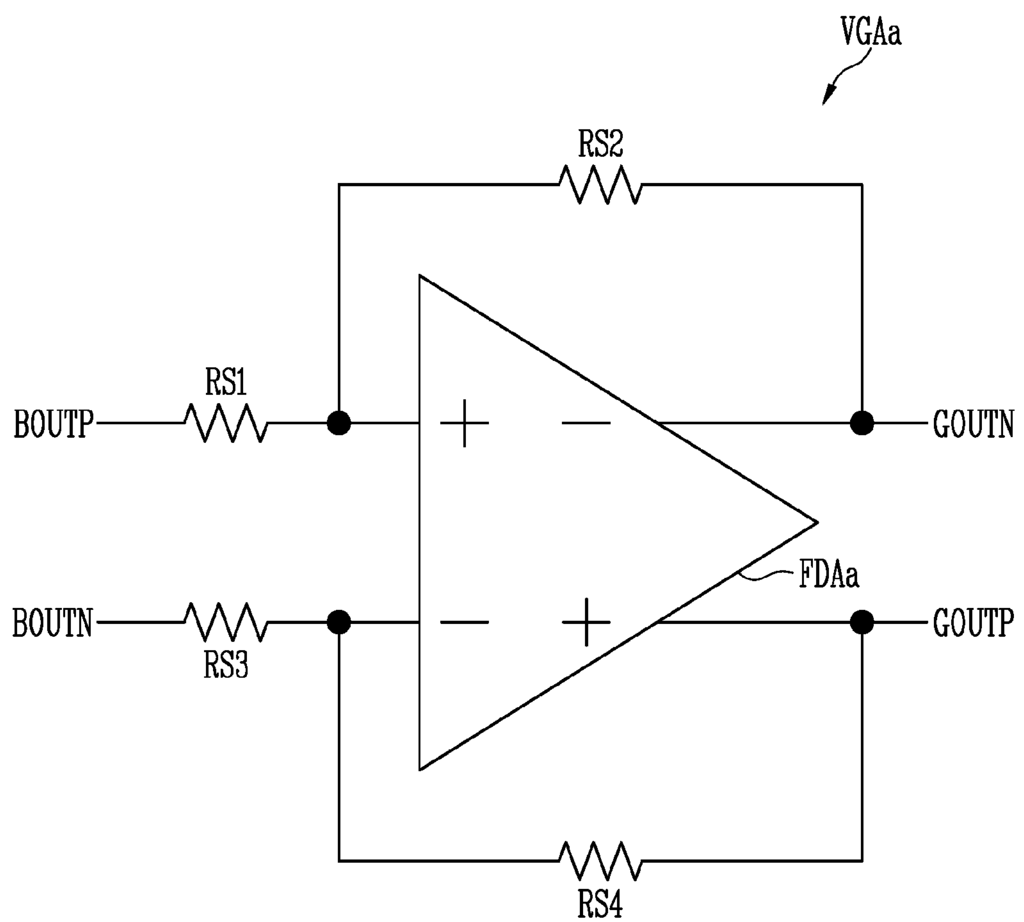
FIG. 19 is a diagram for explaining a gain amplifier according to an embodiment of the present invention.
Figure 20:
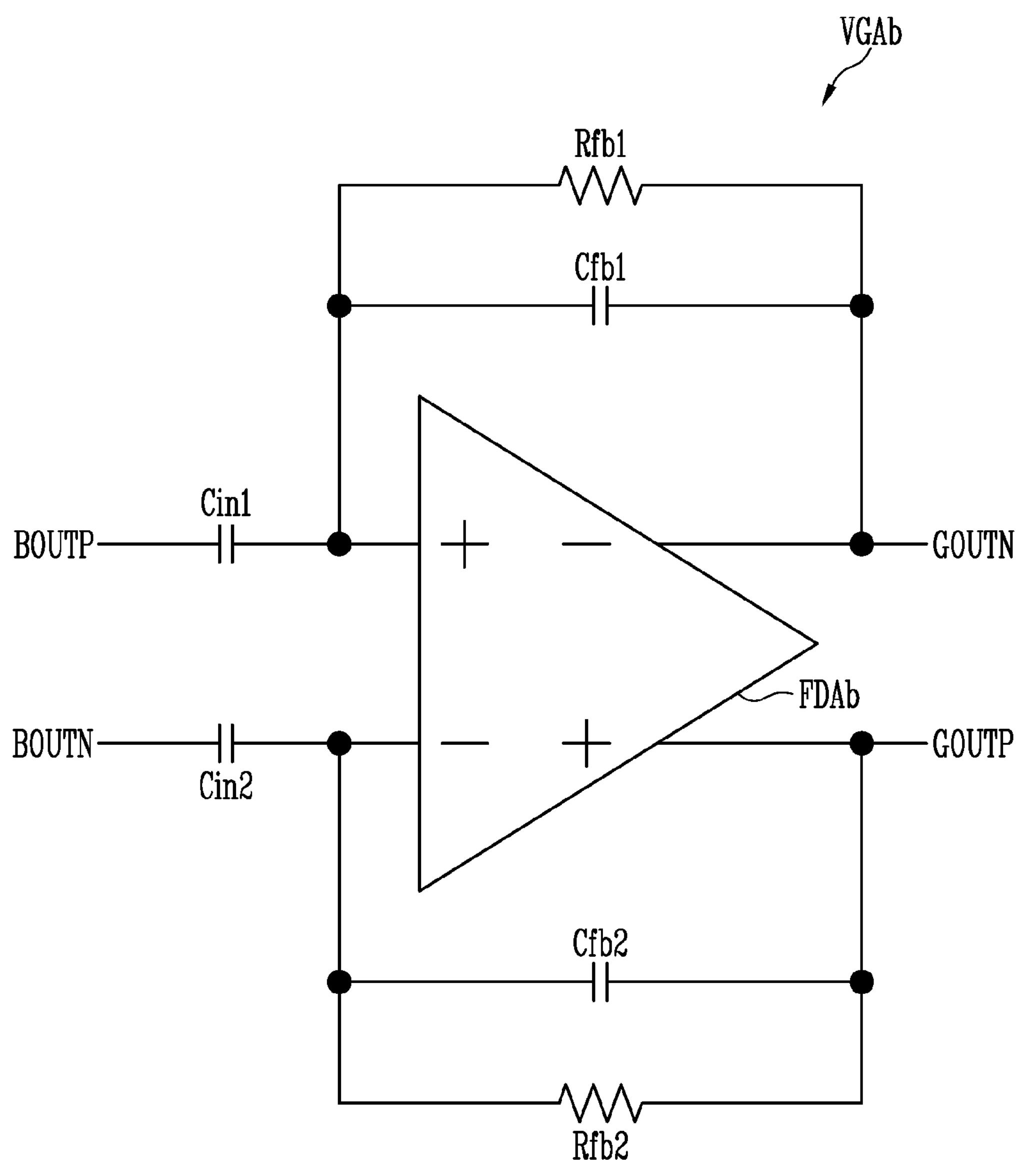
FIG. 20 is a diagram for explaining a gain amplifier according to an embodiment of the present invention.

FIG. 19 is a diagram for explaining a gain amplifier according to an embodiment of the present invention. FIG. 20 is a diagram for explaining a gain amplifier according to an embodiment of the present invention.

Referring to FIG. 19, a gain amplifier VGAa according to an embodiment of the present invention may be implemented as a resistive feedback inverting amplifier. For example, the gain amplifier VGAa may include a fully differential amplifier FDAa, a first resistor RS1, a second resistor RS2, a third resistor RS3, and a fourth resistor RS4. The gain amplifier VGAa may be used to implement the gain amplifier VGA of FIG. 6.

The fully differential amplifier FDAa may include a non-inverting input terminal, an inverting input terminal, an inverting output terminal, and a non-inverting output terminal. The inverting output terminal of the fully differential amplifier FDAa may output an output signal GOUTN. The non-inverting output terminal of the fully differential amplifier FDAa may output an output signal GOUTP. The first resistor RS1 may be connected between a first input terminal of the gain amplifier VGAa receiving the output signal BOUTP and the non-inverting input terminal of the full differential amplifier FDAa. The second resistor RS2 may be connected between the inverting output terminal and the non-inverting input terminal of the fully differential amplifier FDAa. The third resistor RS3 may be connected between a second input terminal of the gain amplifier VGAa receiving the output signal BOUTN and the inverting input terminal of the full differential amplifier FDAa. The fourth resistor RS4 may be connected between the non-inverting output terminal and the inverting input terminal of the fully differential amplifier FDAa.

A resistance ratio of the first resistor RS1 and the second resistor RS2 may be the same as a resistance ratio of the third resistor RS3 and the fourth resistor RS4. For example, the gain of the gain amplifier VGAa may be determined as in Equation 5 below.

$$A=R2/R1=R4/R3 \quad \text{[Equation 5]}$$

Here, A may be the gain, R2 may be a resistance value of the second resistor RS2, R1 may be a resistance value of the first resistor RS1, R4 may be a resistance value of the fourth resistor RS4, and R3 may be a resistance value of the third resistor RS3.

Referring to FIG. 20, a gain amplifier VGAb according to an embodiment of the present invention may be implemented as a capacitive feedback inverting amplifier. The gain amplifier VGAb may be used to implement the gain amplifier VGA of FIG. 6. For example, the gain amplifier VGAb may include a fully differential amplifier FDAb, a first input capacitor Cin1, a first feedback resistor Rfb1, a first feedback capacitor Cfb1, a second input capacitor Cin2, a second feedback resistors Rfb2, and a second feedback capacitor Cfb2. An inverting output terminal of the fully differential amplifier FDAb may output an output signal GOUTN. A non-inverting output terminal of the fully differential amplifier FDAb may output an output signal GOUTP.

The first input capacitor Cin1 may be connected between a first input terminal of the gain amplifier VGAb and a non-inverting input terminal of the fully differential amplifier FDAb. The first feedback capacitor Cfb1 and the first feedback resistor Rfb1 may be connected in parallel between the inverting output terminal and the non-inverting input terminal of the fully differential amplifier FDAb. The second input capacitor Cin2 may be connected between a second input terminal of the gain amplifier VGAb and an inverting input terminal of the full differential amplifier FDAb. The second feedback capacitor Cfb2 and the second feedback resistor Rfb2 may be connected in parallel between the non-inverting output terminal and the inverting input terminal of the fully differential amplifier FDAb.

A capacitance ratio of the first input capacitor Cin1 and the first feedback capacitor Cfb1 may be the same as a capacitance ratio of the second input capacitor Cin2 and the second feedback capacitor Cfb2. For example, the gain of the gain amplifier VGAb may be determined as in Equation 6 below.

$$A=CCin1/CCfb1=CCin2/CCfb2 \quad \text{[Equation 6]}$$

Here, A may be the gain, CCin1 may be a capacitance value of the first input capacitor Cin1, CCfb1 may be a capacitance value of the first feedback capacitor Cfb1, CCin2 may be a capacitance value of the second input capacitor Cin2, and CCfb2 may be a capacitance value of the second feedback capacitor Cfb2.

The gain amplifier VGAa of FIG. 19 may be implemented in a small area. The gain amplifier VGAb of FIG. 20 may be capable of removing an input offset and setting a center frequency like a band pass filter.

FIGS. 21 to 26 are diagrams for explaining amplifiers applicable to the band pass filter. For example, the amplifiers depicted in FIGS. 21 to 26 may be used to implement the differential amplifiers FDAa or FDAb.

Figure 21:
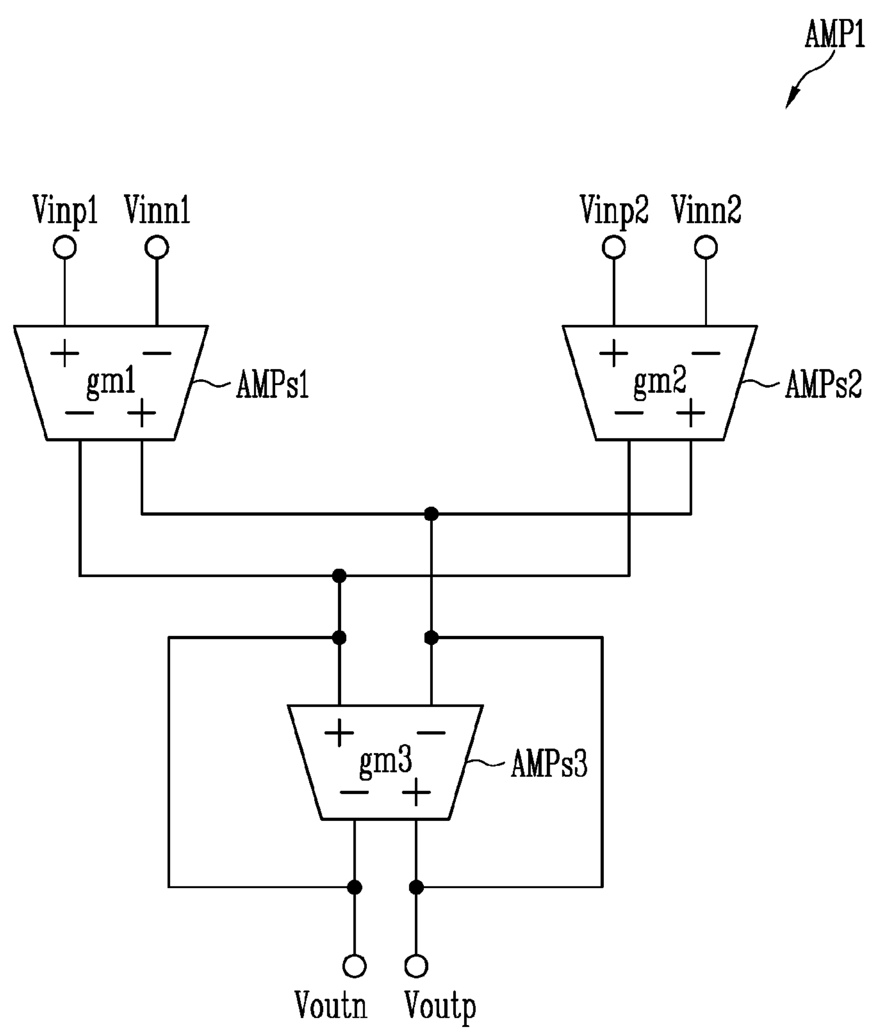
FIGS. 21 to 26 are diagrams for explaining amplifiers applicable to the band pass filter.

An amplifier AMP1 of FIG. 21 may include a plurality of sub-amplifiers AMPs1, AMPs2, and AMPs3. For example, each of the sub-amplifiers AMPs1, AMPs2, and AMPs3 may be configured as a transconductance amplifier.

The input/output relationship of the amplifier shown in FIG. 21 can be expressed as Equation 7 below.

$$Voutp=(gm1/gm3)*(Vinp1-Vinn1)+(gm2/gm3)*(Vinp2-Vinn2) \quad \text{[Equation 7]}$$

Here, gm1 may be a transfer conductance of the sub-amplifier AMPs1, gm3 may be a transfer conductance of the sub-amplifier AMPs3, Vinp1 may be an input signal of a non-inverting terminal of the sub-amplifier AMPs1, Vinn1 may be an input signal of an inverting terminal of the sub-amplifier AMPs1, gm2 may be a transfer conductance of the sub-amplifier AMPs2, Vinp2 may be an input signal of a non-inverting terminal of the sub-amplifier AMPs2, and Vinn2 may be an input signal of an inverting terminal of the sub-amplifier AMPs2. In this case, gm1 and gm2 may have the same value. In addition, Voutn may have the same magnitude as Voutp, but may be a voltage having a different sign.

Figure 22:
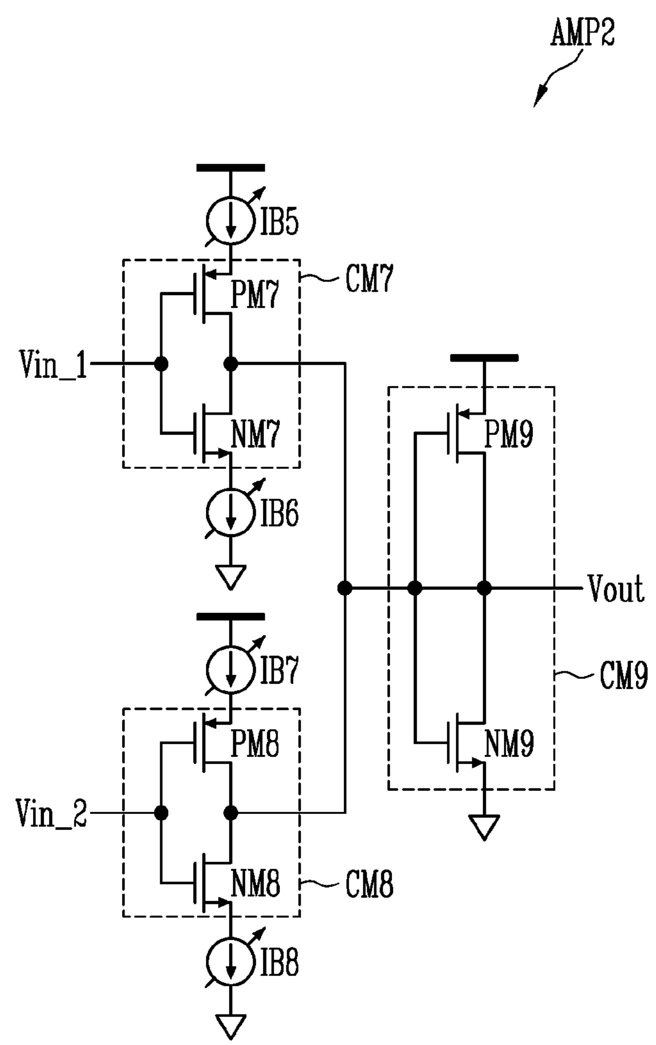

An amplifier AMP2 of FIG. 22 may include transistors PM7, PM8, PM9, NM7, NMM8, and NM9. The P-type transistor PM7 and the N-type transistor NM7 may form a CMOS transistor CM7 connected in series between a high voltage and a low voltage. The P-type transistor PM8 and the N-type transistor NM8 may form a CMOS transistor CM8 connected in series between the high voltage and the low voltage. The P-type transistor PM9 and the N-type transistor NM9 form a CMOS transistor CM9 connected in series between the high voltage and the low voltage. The amplifier AMP2 may selectively include variable current sources IBS, IB6, IB7, and IBB.

A first input signal Vin_1 may be applied to gate electrodes of the transistors PM7 and NM7. A second input signal Vin_2 may be applied to gate electrodes of the transistors PM8 and NM8. Drain electrodes of the transistors PM7, PM8, NM7, and NM8 may be connected to gate electrodes of the transistors PM9 and NM9. An output signal Vout of the amplifier AMP2 may be output from drain electrodes of the transistors PM9 and NM9.

Figure 23:
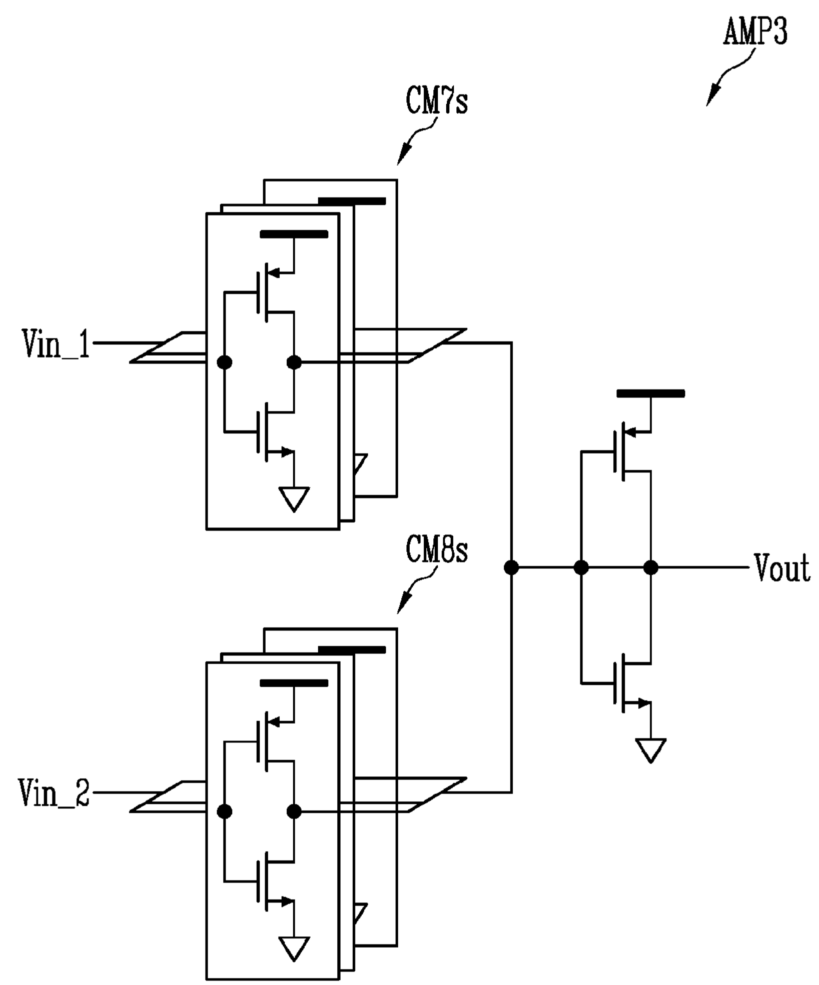

An amplifier AMP5 of FIG. 23 may be configured similarly to the amplifier AMP2 of FIG. 22, but there is a difference in that the CMOS transistor CM7 may be a plurality of CMOS transistors CM7*s* connected in parallel, and the CMOS transistor CM8 may be a plurality of CMOS transistors CM8*s* connected in parallel.

Figure 24:
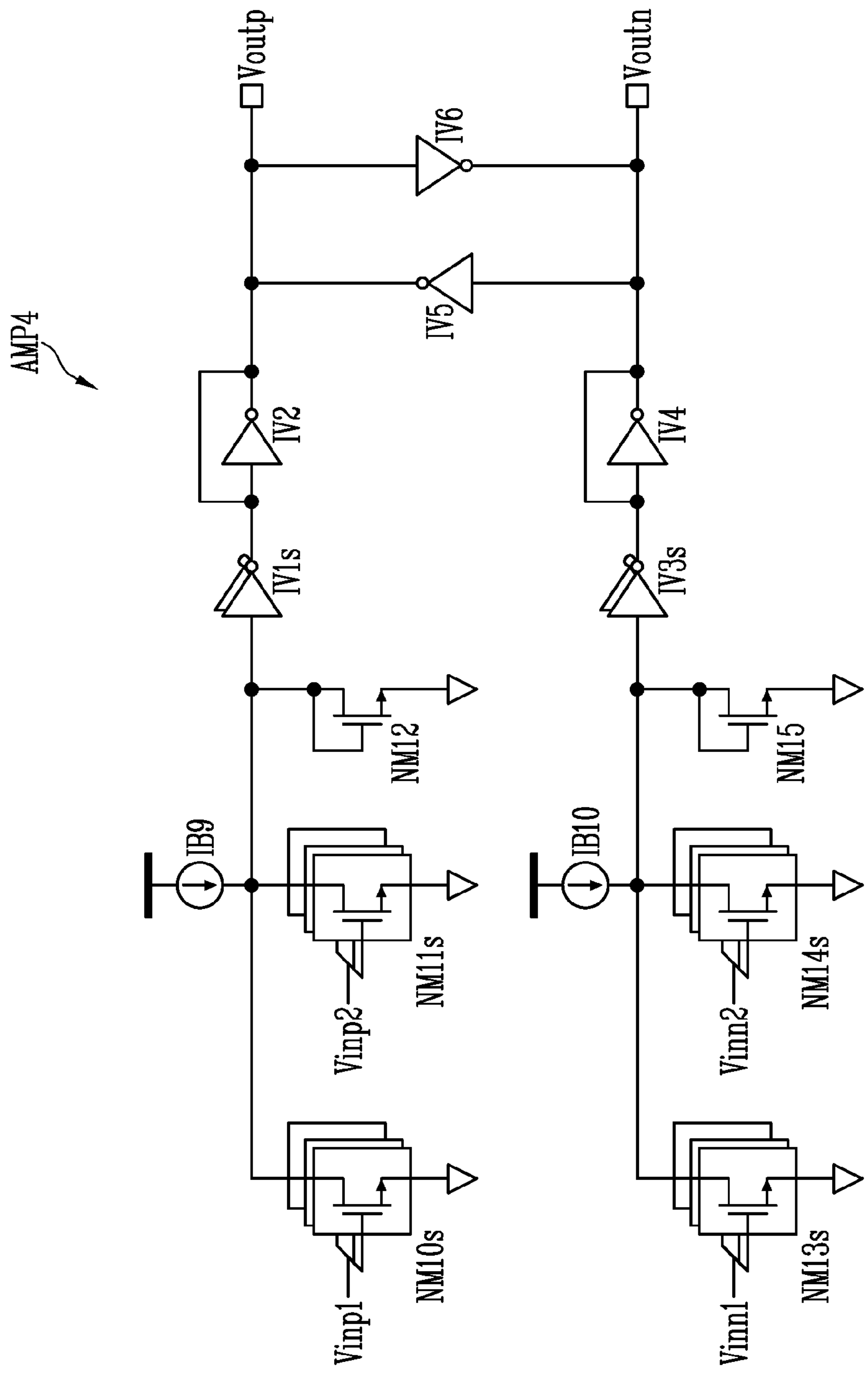

An amplifier AMP4 of FIG. 24 may include a plurality of transistors NM10*s*, NM11*s*, NM12, NM13*s*, NM14*s*, and NM15 and a plurality of inverters IV1*s*, IV2, IV3*s*, IV4, IV5, and IV6.

The transistors NM10*s* connected in parallel may receive a first input signal Vinp1 through gate electrodes. The transistors NM11*s* connected in parallel may receive a second input signal Vinp2 through gate electrodes. Drain electrodes of the transistors NM10*s*, NM11*s*, and NM12 may be connected to a high voltage, and source electrodes of the transistors NM10*s*, NM11*s*, and NM12 may be connected to a low voltage. According to an embodiment, a current source IB9 may be positioned between the high voltage and the drain electrodes of the transistors NM10*s*, NM11*s*, and NM12. The transistor NM12 may be connected in the form of a diode (e.g., diode connected or drain connected to gate). Input terminals of the inverters IV1*s* connected in parallel may be connected to the drain electrodes of the transistors NM10*s*, NM11*s*, and NM12. An input terminal of the inverter IV2 may be connected to an output terminal of the inverters IV1*s* and an output terminal of the inverter IV2.

The transistors NM13*s* connected in parallel may receive a third input signal Vinn1 through gate electrodes. The transistors NM14*s* connected in parallel may receive a fourth input signal Vinn2 through gate electrodes. Drain electrodes of the transistors NM13*s*, NM14*s*, and NM15 may be connected to the high voltage, and source electrodes of the transistors NM13*s*, NM14*s*, and NM15 may be connected to the low voltage. According to an embodiment, a current source IB10 may be positioned between the high voltage and the drain electrodes of the transistors NM13*s*, NM14*s*, and NM15. The transistor NM15 may be connected in the form of a diode (e.g., diode connected or drain connected gate). Input terminals of the inverters IV3*s* connected in parallel may be connected to the drain electrodes of the transistors NM13*s*, NM14*s*, and NM15. An input terminal of the inverter IV4 may be connected to output terminals of the inverters IV3*s* and an output terminal of the inverter IV4.

The inverter IV2 may output a first output signal Voutp through an output terminal. The inverter IV4 may output a second output signal Voutn through an output terminal. An input terminal of the inverter IV5 may be connected to the output terminal of the inverter IV4, and an output terminal of the inverter IV5 may be connected to the output terminal of the inverter IV2. An input terminal of the inverter IV6 may be connected to the output terminal of the inverter IV2, and an output terminal of the inverter IV6 may be connected to the output terminal of the inverter IV4.

Figure 25:
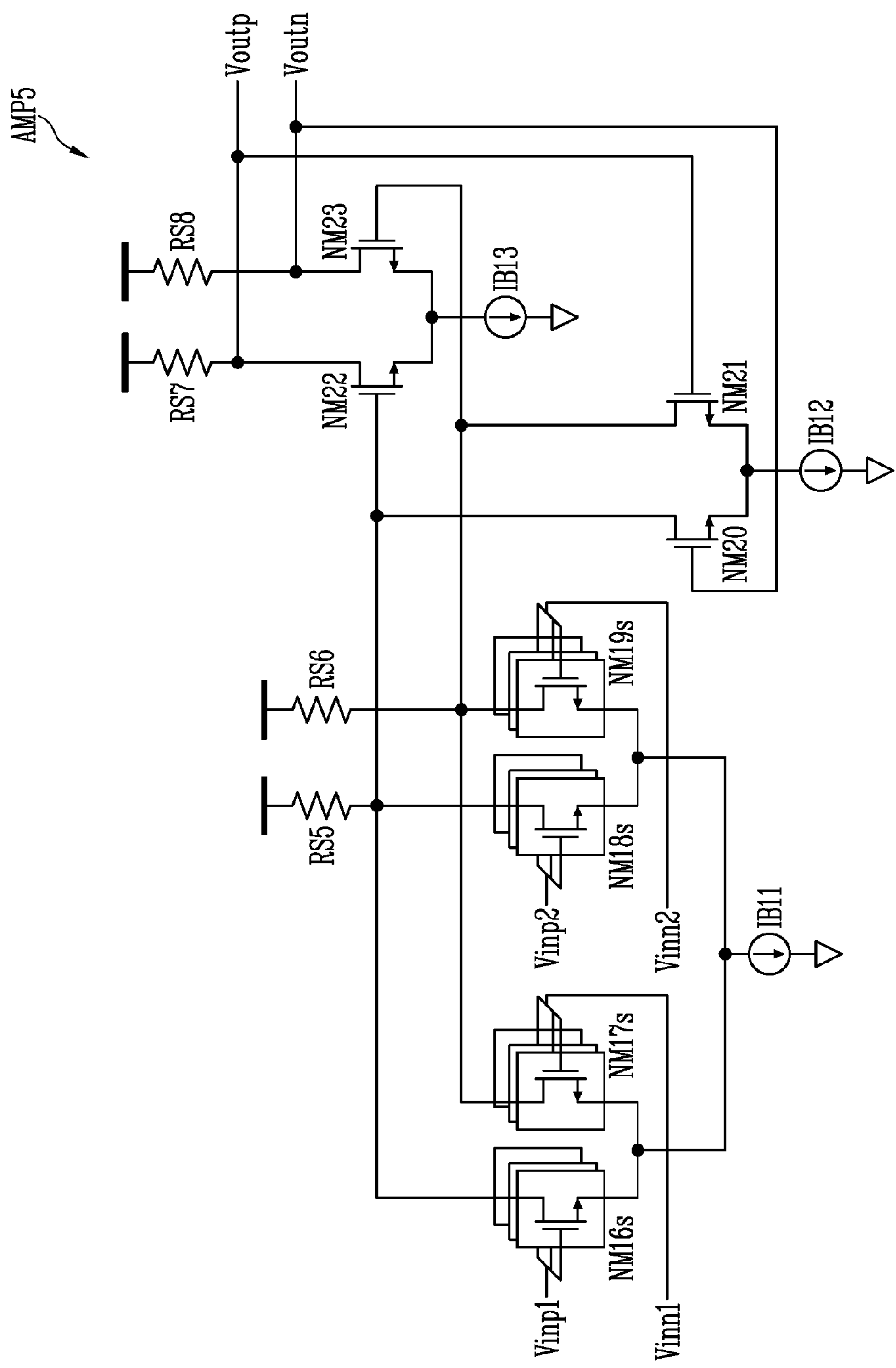

An amplifier AMP5 of FIG. 25 may include a plurality of transistors NM16*s*, NM17*s*, NM18*s*, NM19*s*, NM20, NM21, NM22, and NM23, resistors RS5, RS6, RS7, and RS8, and current sources IB11, IB12, and IB13.

First electrodes of the resistors RS5, RS6, RS7, and RS8 may be connected to a high voltage. The current sources IB11, IB12, and IB13 may be connected to a low voltage. Source electrodes of the transistors NM16*s*, NM17*s*, NM18*s*, NM19*s*, NM20, NM21, NM22, and NM23 may be connected to the corresponding current sources IB11, IB12, and IB13. Drain electrodes of the transistors NM16*s*, NM17*s*, NM18*s*, NM19*s*, NM20, NM21, NM22, and NM23 may be connected to second electrodes of the corresponding resistors RS5, RS6, RS7, and RS8.

The transistors NM16*s* connected in parallel may receive a first input signal Vinp1 through gate electrodes. The transistors NM17*s* connected in parallel may receive a second input signal Vinn1 through gate electrodes. The transistors NM18*s* connected in parallel may receive a third input signal Vinp2 through gate electrodes. The transistors NM19*s* connected in parallel may receive a fourth input signal Vinn2 through gate electrodes.

A gate electrode of the transistor NM22 may be connected to a second electrode of the resistor RS5, and a drain electrode of the transistor NM22 may output a first output signal Voutp. A gate electrode of the transistor NM23 may be connected to a second electrode of the resistor RS6, and a drain electrode of the transistor NM23 may output a second output signal Voutn.

Figure 26:
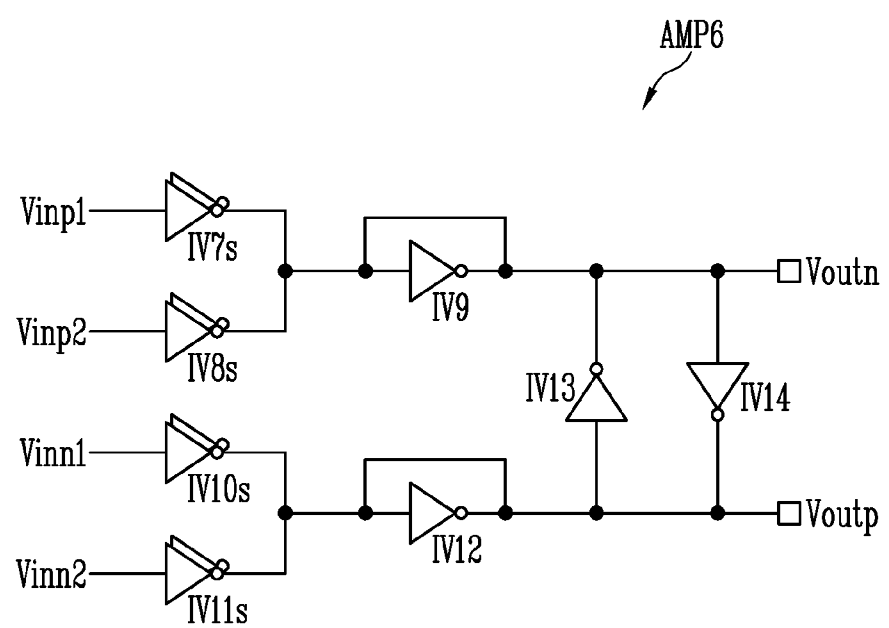

An amplifier AMP6 of FIG. 26 may include a plurality of inverters IV7*s*, IV8*s*, IV9, IV10*s*, IV11*s*, IV12, IV13, and IV14.

The inverters IV7*s* connected in parallel may receive a first input signal Vinp1 through input terminals. The inverters IV8*s* connected in parallel may receive a second input signal Vinp2 through input terminals. An input terminal of the inverter IV9 may be connected to output terminals of the inverters IV7*s*, IV8*s*, and IV9. An output terminal of the inverter IV9 may output a first output signal Voutn.

The inverters IV10*s* connected in parallel may receive a third input signal Vinn1 through input terminals. The inverters IV11*s* connected in parallel may receive a fourth input signal Vinn2 through input terminals. An input terminal of the inverter IV12 may be connected to output terminals of the inverters IV01*s*, IV11*s*, and IV12. An output terminal of the inverter IV12 may output a second output signal Voutp.

An input terminal of the inverter IV13 may be connected to an output terminal of the inverter IV12, and an output terminal of the inverter IV13 may be connected to an output terminal of the inverter IV9. An input terminal of the inverter IV14 may be connected to an output terminal of the inverter IV9, and an output terminal of the inverter IV14 may be connected to an output terminal of the inverter IV12.

A sensor device and a driving method thereof according to at least one embodiment of the present invention may independently set parameters of a band pass filter.

The drawings referred to heretofore and the detailed description of the invention described above are merely illustrative of the invention. It is to be understood that the invention has been disclosed for illustrative purposes only and is not intended to limit the meaning or scope of the invention as set forth in the claims. Therefore, those skilled in the art will appreciate that various modifications and equivalent embodiments are possible without departing from the scope of the invention as set forth in the following claims.

What is claimed is:

1. A sensor device comprising:

a plurality of first sensors receiving a plurality of driving signals;

a plurality of second sensors outputting a plurality of sensing signals in response to the driving signals; and a sensor receiver receiving the sensing signals from the second sensors, and including a charge amplifier and a band pass filter filtering the sensing signals, wherein the band pass filter includes:

a multi-path filter in which a frequency of the driving signals is set as a center frequency;

a gain amplifier amplifying signals filtered through the multi-path filter according to a predetermined gain value; and a buffer isolating the multi-path filter and the gain amplifier from each other, wherein the charge amplifier generates a first input signal corresponding to a difference between the sensing signals from two of the second sensors and a second input signal inverted from the first input signal, for output to the multi-path filter.

2. The sensor device of claim 1, wherein at least one output terminal of the multi-path filter is connected to at least one input terminal of the buffer, and wherein at least one output terminal of the buffer is connected to at least one input terminal of the gain amplifier.

3. The sensor device of claim 1, wherein at least one input terminal of the band pass filter is connected to at least one output terminal of the charge amplifier.

4. The sensor device of claim 1, wherein the multi-path filter includes a plurality of first paths connected in parallel between a first input terminal and a first output terminal and a plurality of second paths connected in parallel between a second input terminal and a second output terminal, and wherein the first paths and the second paths share same filters.

5. The sensor device of claim 4, wherein one of the first paths sequentially includes a first input mixer, a first filter, and a first output mixer, wherein one of the second paths includes a second input mixer and a second output mixer, wherein an output terminal of the second input mixer is connected to an input terminal of the first filter, and wherein an input terminal of the second output mixer is connected to an output terminal of the first filter.

6. The sensor device of claim 5, wherein a frequency and a phase of a first input clock signal received by the first input mixer are the same as a frequency and a phase of a first output clock signal received by the first output mixer, wherein a frequency and a phase of a second input clock signal received by the second input mixer are the same as a frequency and a phase of a second output clock signal received by the second output mixer, wherein the frequency of the first input clock signal is the same as the frequency of the second input clock signal, and wherein the phase of the first input clock signal is different from the phase of the second input clock signal.

7. The sensor device of claim 1, wherein the buffer includes a differential difference amplifier including a first non-inverting input terminal, a first inverting input terminal, a second non-inverting input terminal, a second inverting input terminal, an inverting output terminal, and a non-inverting output terminal, wherein an output signal of the inverting output terminal of the differential difference amplifier is fed back to the first non-inverting input terminal, wherein an output signal of the non-inverting output terminal of the differential difference amplifier is fed back to the second inverting input terminal, wherein the first inverting input terminal and the second non-inverting input terminal of the differential difference amplifier are connected to output terminals of the multi-path filter, and wherein the inverting output terminal and the non-inverting output terminal of the differential difference amplifier are connected to input terminals of the gain amplifier.

8. The sensor device of claim 1, wherein the buffer includes a differential difference amplifier including a first non-inverting input terminal, two or more first inverting input terminals, two or more second non-inverting input terminals, a second inverting input terminal, an inverting output terminal, and a non-inverting output terminal, wherein an output signal of the inverting output terminal of the differential difference amplifier is fed back to the first non-inverting input terminal, wherein an output signal of the non-inverting output terminal of the differential difference amplifier is fed back to the second inverting input terminal, wherein the first inverting input terminals and the second non-inverting input terminals of the differential difference amplifier are connected to output terminals of the multi-path filter, and wherein the inverting output terminal and the non-inverting output terminal of the differential difference amplifier are connected to input terminals of the gain amplifier.

9. The sensor device of claim 1, wherein the gain amplifier includes:

a fully differential amplifier including a non-inverting input terminal, an inverting input terminal, an inverting output terminal, and a non-inverting output terminal;

a first resistor connected between a first input terminal of the gain amplifier and the non-inverting input terminal of the fully differential amplifier;

a second resistor connected between the inverting output terminal and the non-inverting input terminal of the fully differential amplifier; a third resistor connected between a second input terminal of the gain amplifier and the inverting input terminal of the fully differential amplifier; and a fourth resistor connected between the non-inverting output terminal and the inverting input terminal of the fully differential amplifier, wherein a resistance ratio of the first resistor and the second resistor is the same as a resistance ratio of the third resistor and the fourth resistor.

10. The sensor device of claim 1, wherein the gain amplifier includes:

a fully differential amplifier including a non-inverting input terminal, an inverting input terminal, an inverting output terminal, and a non-inverting output terminal;

a first input capacitor connected between a first input terminal of the gain amplifier and the non-inverting input terminal of the fully differential amplifier;

a first feedback capacitor and a first feedback resistor connected in parallel between the inverting output terminal and the non-inverting input terminal of the fully differential amplifier;

a second input capacitor connected between a second input terminal of the gain amplifier and the inverting input terminal of the fully differential amplifier; and a second feedback capacitor and a second feedback resistor connected in parallel between the non-inverting output terminal and the inverting input terminal of the fully differential amplifier, wherein a capacitance ratio of the first input capacitor and the first feedback capacitor is the same as a capacitance ratio of the second input capacitor and the second feedback capacitor.

11. A sensor device comprising:

a plurality of first sensors receiving a plurality of driving signals;

a plurality of second sensors outputting a plurality of sensing signals in response to the driving signals; and a sensor receiver receiving the sensing signals from the second sensors, and including a band pass filter filtering the sensing signals, wherein the band pass filter includes:

a multi-path filter in which a frequency of the driving signals is set as a center frequency;

a gain amplifier amplifying signals filtered through the multi-path filter according to a predetermined gain value; and a buffer isolating the multi-path filter and the gain amplifier from each other, wherein the multi-path filter includes a plurality of paths connected in parallel between an input terminal and an output terminal, wherein a first path among the plurality of paths sequentially includes a first input mixer, a first filter, and a first output mixer, and wherein a frequency and a phase of a first input clock signal received by the first input mixer are the same as a frequency and a phase of a first output clock signal received by the first output mixer.

12. The sensor device of claim 11, wherein a second path among the plurality of paths sequentially includes a second input mixer, a second filter, and a second output mixer, wherein a frequency and a phase of a second input clock signal received by the second input mixer are the same as a frequency and a phase of a second output clock signal received by the second output mixer, wherein the frequency of the first input clock signal is the same as the frequency of the second input clock signal, and wherein the phase of the first input clock signal is different from the phase of the second input clock signal.

13. A driving method of a sensor device comprising:

supplying driving signals to a plurality of first sensors;

receiving sensing signals from two adjacent second sensors;

amplifying a difference between the sensing signals to generate an amplified signal and an inverted signal that is inverted with respect to the amplified signal; and filtering the amplified signal and the inverted signal through a band pass filter, wherein the band pass filter includes:

a multi-path filter in which a frequency of the driving signals is set as a center frequency, the multi-path filter receiving the amplified signal and the inverted signal;

a gain amplifier amplifying signals filtered through the multi-path filter according to a predetermined gain value; and a buffer isolating the multi-path filter and the gain amplifier from each other.

14. The driving method of claim 13, wherein at least one output terminal of the multi-path filter is connected to at least one input terminal of the buffer, and wherein at least one output terminal of the buffer is connected to at least one input terminal of the gain amplifier.

15. The driving method of claim 13, wherein the multi-path filter includes a plurality of paths connected in parallel between an input terminal and an output terminal, wherein a first path among the plurality of paths sequentially includes a first input mixer, a first filter, and a first output mixer, and wherein a frequency and a phase of a first input clock signal received by the first input mixer are the same as a frequency and a phase of a first output clock signal received by the first output mixer.

16. The driving method of claim 15, wherein a second path among the plurality of paths sequentially includes a second input mixer, a second filter, and a second output mixer, wherein a frequency and a phase of a second input clock signal received by the second input mixer are the same as a frequency and a phase of a second output clock signal received by the second output mixer, wherein the frequency of the first input clock signal is the same as the frequency of the second input clock signal, and wherein the phase of the first input clock signal is different from the phase of the second input clock signal.

17. The driving method of claim 13, wherein the multi-path filter includes a plurality of first paths connected in parallel between a first input terminal and a first output terminal and a plurality of second paths connected in parallel between a second input terminal and a second output terminal, and wherein the first paths and the second paths share same filters.

18. The driving method of claim 17, wherein one of the first paths sequentially includes a first input mixer, a first filter, and a first output mixer, wherein one of the second paths includes a second input mixer and a second output mixer, wherein an output terminal of the second input mixer is connected to an input terminal of the first filter, wherein an input terminal of the second output mixer is connected to an output terminal of the first filter, wherein a frequency and a phase of a first input clock signal received by the first input mixer are the same as a frequency and a phase of a first output clock signal received by the first output mixer, wherein a frequency and a phase of a second input clock signal received by the second input mixer are the same as a frequency and a phase of a second output clock signal received by the second output mixer, wherein the frequency of the first input clock signal is the same as the frequency of the second input clock signal, and wherein the phase of the first input clock signal is different from the phase of the second input clock signal.

19. The driving method of claim 13, wherein the buffer includes a differential difference amplifier including a first non-inverting input terminal, a first inverting input terminal, a second non-inverting input terminal, a second inverting input terminal, an inverting output terminal, and a non-inverting output terminal, wherein an output signal of the inverting output terminal of the differential difference amplifier is fed back to the first non-inverting input terminal, wherein an output signal of the non-inverting output terminal of the differential difference amplifier is fed back to the second inverting input terminal, wherein the first inverting input terminal and the second non-inverting input terminal of the differential difference amplifier are connected to output terminals of the multi-path filter, and wherein the inverting output terminal and the non-inverting output terminal of the differential difference amplifier are connected to input terminals of the gain amplifier.

20. The driving method of claim 13, wherein the buffer includes a differential difference amplifier including a first non-inverting input terminal, two or more first inverting input terminals, two or more second non-inverting input terminals, a second inverting input terminal, a non-inverting output terminal, and an inverting output terminal, wherein an output signal of the non-inverting output terminal of the differential difference amplifier is fed back to the first non-inverting input terminal, wherein an output signal of the inverting output terminal of the differential difference amplifier is fed back to the second inverting input terminal, wherein the first inverting input terminals and the second non-inverting input terminals of the differential difference amplifier are connected to output terminals of the multi-path filter, and wherein the inverting output terminal and the non-inverting output terminal of the differential difference amplifier are connected to input terminals of the gain amplifier.

* * * * *